United States Patent
Hans et al.

(10) Patent No.: US 6,471,837 B1
(45) Date of Patent: Oct. 29, 2002

(54) VACUUM COATING INSTALLATION AND COUPLING DEVICE

(75) Inventors: Michael Hans, Bludenz (AT); Martin Zaech, Balzers (LI)

(73) Assignee: Unaxis Trading AG, Trubbach (CH)

(*) Notice: Subject to any disclaimer, the term of this patent is extended or adjusted under 35 U.S.C. 154(b) by 0 days.

(21) Appl. No.: 09/537,293

(22) Filed: Mar. 29, 2000

Related U.S. Application Data

(63) Continuation of application No. PCT/CH98/00411, filed on Sep. 25, 1998.

(30) Foreign Application Priority Data

Sep. 29, 1997 (CH) ................................................. 2278/97
Aug. 25, 1998 (CH) ................................................. 1736/98

(51) Int. Cl.[7] .......................... C23C 14/34; C25B 11/00; B05C 11/00; B05C 13/00
(52) U.S. Cl. ............................. 204/298.41; 204/298.15; 204/298.25; 204/298.23; 118/723 R; 118/500; 118/702
(58) Field of Search .................. 204/298.15, 298.23, 204/298.25, 298.26, 298.27, 298.41; 118/700, 702, 723 R, 500

(56) References Cited

U.S. PATENT DOCUMENTS 4,785,962 A * 11/1988 Toshima ..................... 220/260
4,951,601 A * 8/1990 Maydan et al. ............. 118/719
5,288,379 A * 2/1994 Namiki et al. ......... 204/192.12
5,766,360 A * 6/1998 Sato et al. ................... 118/666

FOREIGN PATENT DOCUMENTS

| DE | 3338580 | 5/1985 | ............... B01J/3/03 |
| GB | 2 114 160 | 8/1983 | ........... C23C/11/00 |
| JP | 63 062875 | 3/1988 | ........... C23C/14/50 |
| JP | 09 104986 | 4/1997 | ........... C23C/16/54 |

* cited by examiner

Primary Examiner—Steven H. Ver Steeg
(74) Attorney, Agent, or Firm—Crowell & Moring LLP

(57) ABSTRACT

A vacuum coating installation has at least a central distribution station which can be evacuated and has a transport arrangement driven in a controlled manner essentially along a plane, for the material to be treated. One operating station for the distribution station as well as at least two processing stations for the material to be treated are provided. The three or more stations communicate by way of operating openings with the distribution station, through which openings the material to be treated can be transported from one station into the other by the transport arrangement for the material to be treated. The material to be treated is formed by individual workpiece holders of the installation, each having a plurality of workpiece supports. On at least one of the processing stations, a drive and a driving connection, which can be established and released in a controlled manner, between the drive and the workpiece supports of a workpiece holder introduced in the processing station is provided for ensuring a three-dimensional workpiece processing in the processing station.

34 Claims, 15 Drawing Sheets

VACUUM COATING INSTALLATION AND COUPLING DEVICE

CROSS-REFERENCE TO RELATED APPLICATIONS

This application is a continuation of PCT Application No. PCT/CH98/00411 filed on Sep. 25, 1998; and claims priority of 2278/97, filed Sep. 29, 1997 and 1736/98, filed Aug. 25, 1998, the disclosure of which is expressly incorporated by reference herein.

The present invention relates to a vacuum coating installation as well as to a coupling device.

Installations of the first-mentioned type have been known for a long time, in which processing stations, which are grouped around a central distribution station, are operated from the central distribution station by way of a transporting arrangement or a robotic transportation system arranged in the distribution station and the distribution station is operated from the outside by way of an operating station, for example, by way of an inward and outward transfer station or one inward and one outward transfer station. with such installations, workpieces, such as storage disks, semiconductor wafers, are processed individually. Here, the material to be treated is formed by individual work pieces.

On the one hand, these installations permit relatively simple implementation of a desired process-related separation between the processing stations or between the distribution station and the processing stations or the operating station, as required for the very difficult processing on the above-mentioned workpieces. Furthermore, it is typical of such installations that the workpieces are essentially plane and flat, and must normally be processed, for example, coated, only on one side.

By way of these known installations highly difficult, complete layer systems can be implemented, which takes place continuously in a vacuum atmosphere and, as mentioned above, partially with a process-related separation of the individual processing steps.

Because of the high workpiece costs and the high processing costs, a relatively low throughput is accepted in the case of the above-mentioned installations as the result of the individual workpiece handling.

For the processing of workpieces which, with respect to the processing quality, for example, during their coating, are much less critical than the above-mentioned workpieces, thus, for example and particularly, for the application of wearing protection coating systems on tools, for example, for cutting, or on machine construction elements, less attention is paid to the frequency of occurring defective points, for example, with respect to the coating. A high throughput has priority. It is therefore customary to process such workpieces in vacuum coating installations in which a plurality of such workpieces are introduced as a batch and are, in each case, subjected to one processing step. If several vacuum processing steps are required, the batch is often transported as a whole from one installation to other installations and is subjected in-between to the ambient atmosphere.

In addition, the workpieces of the type addressed here, thus, for example, tool bodies of a highly complicated shape, for example, with spiral cutting edges, milling blades, etc., must be processed three-dimensionally. This takes place specifically and particularly also where the body shape is the most complex. It requires special additional measures, such as special movements of the workpiece bodies in the respective processing operation. In the case of large batch units, this significantly complicates the arrangement.

By way of such installations, it is therefore difficult to further reduce to a significant degree the overall manufacturing costs for the workpieces to be processed.

In the case of workpieces of the last-mentioned type, there is also the tendency to increase the quality demands with respect to the processing in many cases. For example, increased demands with respect to the operating efficiency of cutting tools or with respect to the stressing capacity of machine construction elements, in some cases, also result in a raised quality demand with respect to their processing. It is easily understood that the simultaneous meeting of possibly increased quality demands with respect to the processing and the primary throughput demands represent a challenge to the development.

SUMMARY OF THE INVENTION

Under a first aspect, the present invention has the object of suggesting an installation of the initially mentioned type in the case of which, while the advantages of individual-workpiece processing installations of the above-mentioned type are maintained, the high throughputs of batch processing installations are achieved and—if required—, the advantages with respect to the processing quality of the individual workpiece installations can also be implemented at reasonable cost. An installation is to be created which permits high throughputs, requires reasonable costs with respect to its construction and operation and in the case of which the processing is easily reproducible. In the above-mentioned sense, it should be possible to three-dimensionally treat and particularly coat highly complexly shaped workpiece bodies.

This object is achieved by a vacuum processing installation of the first-mentioned type which is characterized by providing the material to be treated is formed by individual workpiece holders of the installation, each having a plurality of workpiece supports, on at least one of the processing stations, a drive and a driving connection configured to be controllably established and released between drive and workpiece supports of a workpiece holder introduced in the processing station is provided for a three-dimensional workpiece processing in the processing station. Thus, no longer are individual workpieces used as the material to be treated but individual workpiece holders, each having a plurality of workpiece supports. In addition, the demanded three-dimensional processing, at least when coating, is implemented in that the workpieces are moved in and with their supports in at least one of the provided processing stations.

As a result, known single-process batch installations, according to the invention, now become processing stations at the installation according to the invention, in which case the transport from one batch installation to another no longer takes place via the ambient atmosphere but according to the invention by way of the distribution station which can be evacuated. Thus, the whole processing takes place in a vacuum. It is therefore also possible to separate the individual processing stations from one another to the required extent with respect to the process, thus the processing stations from the distribution station and therefore, if required, meet high quality demands.

However, primarily, the throughput with respect to the above-mentioned batch installations is not only maintained but even increased.

Furthermore, the installation according to the invention virtually always has at least one coating station.

Although this coating station can be constructed as a low-pressure CVD processing station, it is suggested, particularly with a view to a reasonable-cost application of wearing protection coating systems, that it have at least one plasma discharging distance as well as at least one inlet which is connected with a gas storage device with a reactive gas. In other words, preferably at least one of the stations is constructed as a PVD processing station or as a PECVD processing station.

In this case, for the simultaneous buildup of more complex layers or for the processing of the workpieces by two or more processes successively, several plasma discharging distances can definitely be provided in one processing station and, correspondingly, optionally several reactive gas inlets, if they do not interfere with the respective processing operations to be carried out sequentially—such as sputtering and etching.

For depositing wearing protection coating systems, preferably nitrogen and/or hydrogen and/or a carbon-containing gas and/or a silicon-containing gas is provided in the gas storage device.

If the processing station is constructed as a PVD processing station, it has at least one source which releases vapor particles into the environment. The vapor particles are released, for example, by sputtering from a solid-state target or by the thermal vaporizing from a molten mass or by a mixed form of these techniques, such as cathodic arc vaporizing. The released material is preferably a metal or a metal alloy, preferably containing Ti, W, Al and/or Cr or silicon, or an oxide, nitride, oxynitride, carbide, oxycarbide, oxycarbonitride of one of the above-mentioned metals/alloys. The above-mentioned metal compounds are reactively or non-reactively deposited. For the releasing of the solid-state coating components, the following sources are preferably used:

Vaporizing sources which use thermal vaporizing, as, for example, anodic arc vaporizing sources or electron beam vaporizing sources;

cathodic arc vaporizing sources;

sputtering sources, preferably magnetron sources.

Particularly for the depositing of wearing protection coating systems, it is further contemplated that another of the at least two provided processing stations be a heating station and/or an etching station.

If more than one processing step can be carried out at one and the same processing station, for example, heating as well as etching, a time control unit is preferably operatively connected with the station, which unit controls the sequence of the steps and their process parameters. This reduces the number of required transport steps and saves processing stations.

At the vacuum processing installation according to the invention, a time control unit is preferably provided which, on the one hand, is operatively connected with a drive for the transport arrangement in the distribution station for the material to be treated; on the other hand, the unit is operatively connected with the drive and/or the driving connection at at least one processing station; and controls the time sequence of transport cycles and processing cycles as well as operating cycles.

In another preferred embodiment, it is suggested that a sealing arrangement is provided on the transport arrangement for the material to be treated, which sealing arrangement can be operatively connected in a sealing manner with the openings and can be triggered optionally independently of the lifting movement of the transport arrangement for the material to be treated. This creates the possibility of possibly selectively, for example, in a transfer valve-type manner, close, in a process-related fashion, the opening between the operating station and the distribution station and/or the opening between a processing station and the distribution station, whether by establishing a pressure stage, for example, by a sealing gap; whether by establishing a complete vacuum separation by mutually contacting parts of the sealing arrangement on the transport arrangement and at the addressed opening.

In this case, it is definitely possible to optionally close certain openings in a manner which is not process-related during the operation of the assigned station with respect to the distribution station, such as a connection opening between the heating station and the distribution station, particularly if the additional processing stations can be pumped down separately and during whose operation the respective openings are closed in a process-related manner.

The process-related separating of the stations becomes particularly simple in that sealing elements are fixedly assigned to the workpiece holder or the workpiece holders for workpieces which require such a separation, which sealing elements, forming a unit with the holder, move through the installation.

As initially mentioned, it is often very important to three-dimensionally process without gaps, particularly to coat, three-dimensionally highly complexly shaped workpiece bodies. This is achieved in that, between the workpieces and particularly directed sources, for example, at a processing station for etching or sputter coating, a relative movement is established. For this purpose, it is suggested to provide a driving connection, which finally acts upon the workpiece supports, between a drive and a respective workpiece holder. If, between the station-side stationary source and the workpiece holder, a relative movement is established, particularly preferably a rotational movement, thus ensures an often already sufficient three-dimensional processing. However, in a preferred embodiment, the above-mentioned driving connection is additionally established on workpiece supports which are movably disposed on the workpiece holder, whereby, as particularly by way of a planetary transmission, on the one hand, the workpiece holder and, thereon, on the other hand, the workpiece supports, are caused to carry out a rotational movement, in particular.

Furthermore, for the whole installation, a central control unit is preferably provided which is preferably freely programmable, that is, has optionally retrievable, freely programmed and stored sequences. On the one hand, this control unit pulses the operation of the transport arrangement; on the other hand, it pulses the drive and/or the driving connection at the at least one processing station as well as the operation of valves, thus, for example, transfer valves at the operating station to the distribution station, and, in addition, the process operation of the stations.

When transporting workpiece holders of the initially mentioned type from one station to the other, it is necessary to establish a coupling between the respective stations and the respective workpiece holder; whether this is an electric coupling, for example, for the biasing of the workpieces, or a mechanically coupling, finally, for the rotational drive of the workpieces. Other couplings may also be desirable, as, for example, for a cooling medium which is introduced into the workpiece holders. In order to implement such a coupling, a processing station truncated-cone wheel is provided at the installation of the first-mentioned type on at least one of the processing stations, as well as, at the workpiece holders, a projecting workpiece holder truncated-cone wheel is provided, the faces—preferably at last one of the smaller faces—on the one hand, of the processing station truncated-cone wheel and, in each case, of a workpiece holder truncated-cone wheel resting on one another when the workpiece holder is in the processing position in the processing station. Preferably at least one of the truncated-cone wheels is disposed in an axially resilient manner, whereby, when the workpiece holder with its wheel, preferably in a flat, particularly linear movement, is introduced into the station, the truncated-cone wheels first contact one another along their surface areas and, because of the wedge-effect of the mutually abutting cone envelope surfaces come to rest upon one another, as mentioned above, stressed against the spring force.

In a preferred embodiment, the workpiece-side truncated-cone wheel can be coupled with workpiece supports at the workpiece holder rotary drive, and a motor-operated rotary drive is then provided on the station side, which rotary drive, in the processing position of the workpiece holder, is coupled with the workpiece-holder-side truncated-cone wheel.

The station-side rotary drive, finally, for the workpiece supports on the workpiece holder, preferably operates by way of the station-side truncated-cone wheel onto the workpiece-holder-side truncated-cone wheel, or acts, by way of a drive operating independently of the station-side truncated-cone wheel, onto the workpiece-holder-side truncated-cone wheel.

In a further preferred embodiment of the installation according to the invention—in which the mentioned wheels are not or not only used for the drive transmission—, the station-side truncated-cone wheel as well as the workpiece-holder-side truncated-cone wheel is constructed in an electrically conductive manner at least on the truncated cone faces—in this case, at least on one of the smaller faces—, and the electrically conductive surface of the workpiece-holder-side truncated-cone wheel is connected in an electrically conductive manner with workpiece supports, whereas the electrically conductive small face of the station-side truncated-cone wheel is connected with a preferably adjustable electric source. This permits the establishing of a mechanical drive coupling and/or of an electric connection coupling between respective stations and work-piece holders by the provided truncated-cone wheels.

Although, as mentioned, the above-mentioned coupling forms a preferred embodiment of the initially mentioned installation, it is suggested to use the electric and/or mechanical coupling arrangement always between a vacuum processing station and a workpiece holder with workpieces to be processed in the station, that is, also for single-station installations in that a station-side truncated-cone wheel and a workpiece-holder-side truncated-cone wheel are provided whose faces—in this case, preferably comprising at least one of the smaller faces—rest on one another in the processing position of the workpiece holder in the station and thus establish a mechanical drive connection and/or an electric transmission connection from the station to the workpiece holder.

Furthermore, in a preferred embodiment of the initially first-mentioned processing installation, one shears-type mechanism respectively is provided on the transport arrangement for the material to be treated, in the distribution station, for individual workpiece holders, having a pair of lever arrangements which are centrally swivellably disposed relative to one another such that the lever arms have the same length from the swivel bearing to the respective lever end bearings. In a further preferred embodiment, at least one of the end-disposed lever swivel bearings of the shears-type mechanism is linearly displaceably disposed on a central part of the transport arrangement centrally provided in the distribution station, the shears-type mechanism drive comprising a linear drive for the at least one linearly movably disposed end bearing of the shears-type mechanism or a non-linear drive which preferably acts by way of a cam plate with transmission levers upon one of the shears-type mechanism levers.

If, at the initially first-mentioned processing installations, stations are to be separated with respect to the process, between which relatively large pressure differences exist, preferably starting at 4 mbar, the process-related separation by the above-mentioned sealing plate is preferably additionally secured by a tensioning device which can be operated independently of the transport arrangement. Preferably, this tensioning device has a roller arrangement which can be displaced by a motor, on the station side or the sealing plate side, as well as a cam plate, correspondingly on the sealing plate side or the station side, the roller arrangement being in an operative connection with the curved path the cam plate, for establishing or releasing a sealing pressure between the sealing plate and the opening edge.

Although this above-mentioned additional sealing protection is preferably also used on the initially mentioned, first-mentioned installation, it can naturally also be used on installations in which, for example, only one processing station is provided, as, for example, in the case of transfer stations. Basically, according to the invention, a vacuum processing installation is obtained which has at least one opening of the through-transport or for the processing of workpieces, in the case of which, with respect to the opening, a driven movable sealing plate is provided as well as a tensioning device which is mounted in the area of the opening and has a motor drive for establishing a defined sealing pressure between the sealing plate and the opening edge.

BRIEF DESCRIPTION OF THE DRAWINGS

Other objects, advantages and novel features of the present invention will become apparent from the following detailed description of the invention when considered in conjunction with the accompanying drawings.

DETAILED DESCRIPTION OF THE DRAWINGS

Under one aspect of the invention, the workpieces to be processed are processed on a workpiece holder on the installation according to the invention, which workpiece holder, in order to permit a three-dimensional effect of the processing onto the workpieces, is moved in at least one of the provided processing stations, and is preferably caused to rotate.

Figure 1:
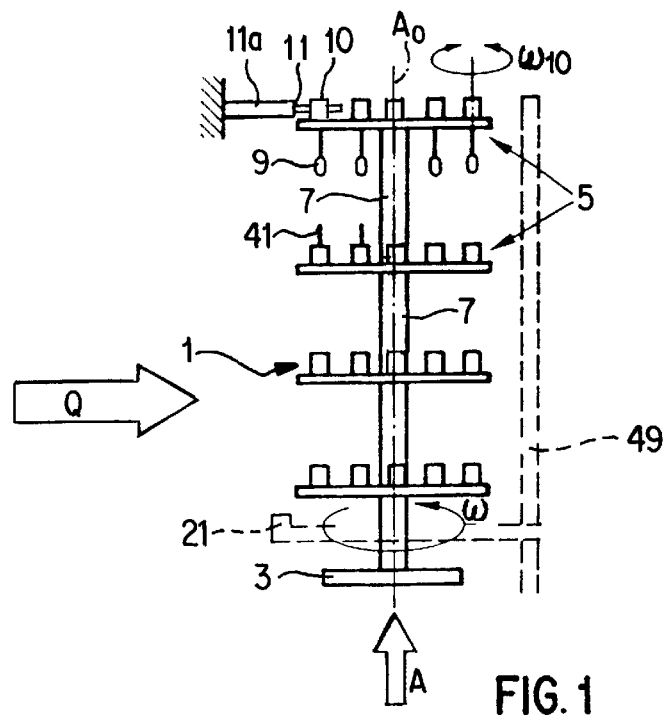
FIG. 1 is a schematic view of a first embodiment of a workpiece holder used on an installation according to the invention.

FIG. 1 illustrates the basic construction of a first workpiece holder used according to the invention, for example, for the processing of shank-type tools. A cylindrical workpiece holder 1 has a rotating coupling arrangement, for example, in the shape of a frictional wheel or gear wheel 3. Several holder plates 5 are arranged along a central shaft 7, on which workpieces 9 are disposed in supporting sleeves 10. By way of the drive transmission schematically illustrated by the arrow A, the workpiece holder 1 at the respective required processing station is caused to rotate, so that a targeted processing effect, which is schematically illustrated by the letter Q, has the required three-dimensional effect on the workpieces.

In the simple embodiment illustrated in FIG. 1, the support sleeves 10 are fixedly mounted on the holder plates 5 and therefore rotate together with the latter about the axis $A_0$. In a further embodiment, the sleeves 10, and therefore the workpieces received therein, as illustrated by view 410, are also caused to rotate themselves. This is implemented in an extremely simple manner in that, on the one hand, the sleeves 10 are rotatably disposed on the plates 5 and, as illustrated at reference number 11, have, for example, projecting driving devices. A stop 11a, which is stationarily arranged with respect to the workpiece holder 1, projects into the moving path of the driving devices 11 at the sleeves 10 such that, each time a sleeve 10 passes by the stop 11a, this sleeve 10 is rotated farther about an angle of rotation element in the 410 direction. As a function of how many stops 11a are arranged along the moving path of the sleeves 10, during one revolution of the plate, a one-time or multiple further incrementing takes place of the angle of rotation of the sleeves 10.

In a further preferred embodiment of the workpiece holder used according to the invention, the workpieces or the supports therefor are moved in a different manner with respect to the workpiece holder, which takes place, for example, by a planetary drive transmission. Such a construction is illustrated, for example, in FIG. 2. It comprises a hollow shaft 22 with support plates 23. A drive coupling wheel, such as a frictional wheel or gear wheel, is fastened to the arrangement 22/23. A drive shaft 27 with an end-disposed gear wheel 29 extends in the hollow shaft 22. Opposite the gear wheel 29, another drive transmission 31 is provided on the drive shaft 27, by way of which drive transmission 31, the drive shaft 27 with the gear wheel 29 is held with respect to the respective processing station, for example, in a stationary manner. Planetary gear wheels 33, which drive driving armatures 35, engage with the gear wheel 29. Holder plates 37 are fastened to the driving armatures 35, on which holder plates 37, the workpieces 41 are placed in support sleeves 39.

As the result of the driving by way of the frictional or gear wheel 25, the workpiece holder 20 is caused to carry out the rotating movement 41. Simultaneously, by way of the planetary drive connection 29/33, the holder plates 37 with the workpiece supports provided thereon in the form of support sleeves 39 are caused to rotate with rotating movement $\omega_2$.

As a further development of the workpiece holder technique explained above by reference to FIG. 2, also here, in addition and as indicated by $\omega_{39}$, the individual support sleeves 39 can also be caused to rotate by a technique explained by reference to FIG. 1.

Figure 14:
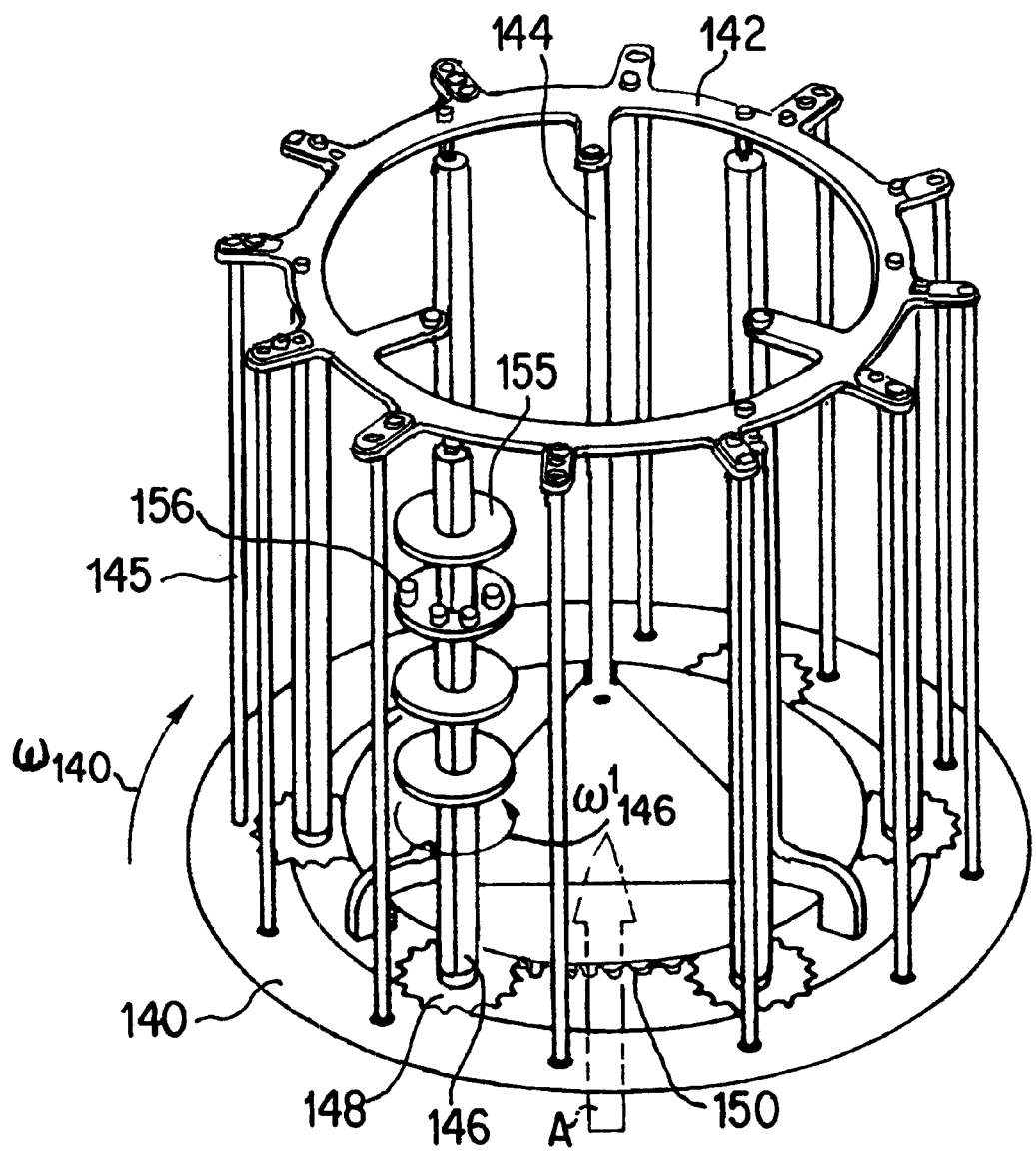
FIG. 14 is a perspective and partially simplified view of another preferred embodiment of a workpiece holder used according to the invention.

FIG. 14 is a perspective view of another preferred embodiment of the workpiece holder used according to the invention. By way of a circular-ring-shaped base plate 140, an also circular-ring-shaped end plate 142, a carrousel-type cage is formed by longitudinal armatures 144. This carrousel-type cage is caused to rotate in the respective processing station, as indicated in FIG. 14 by $\omega_{140}$. In parallel to the armatures 144, rotating armatures 146 are provided and are rotationally movably disposed on the two cage ring plates 140 and 142. By way of gear wheels 148, these rotating armatures 145 act upon a central stationary gear ring 150 so that, while the cage rotates at $\omega_{140}$, they themselves rotate at $\omega_{146}$. Analogous to FIG. 1, rotary plates 155 are arranged on the rotating armatures 146, having support sleeves 156 which are rotationally disposed and rotationally driven on the plates 155 themselves. The schematically illustrated stops 11a according to FIG. 1 are formed by rods 145 or are held thereon and project from there into the revolving paths of the sleeves on the plates 155.

As mentioned above, FIGS. 1, 2 and 14 basically show workpiece holders which can be used on single-station installations as well as according to the invention on multi-station installations of the type described in the following.

Figure 2:
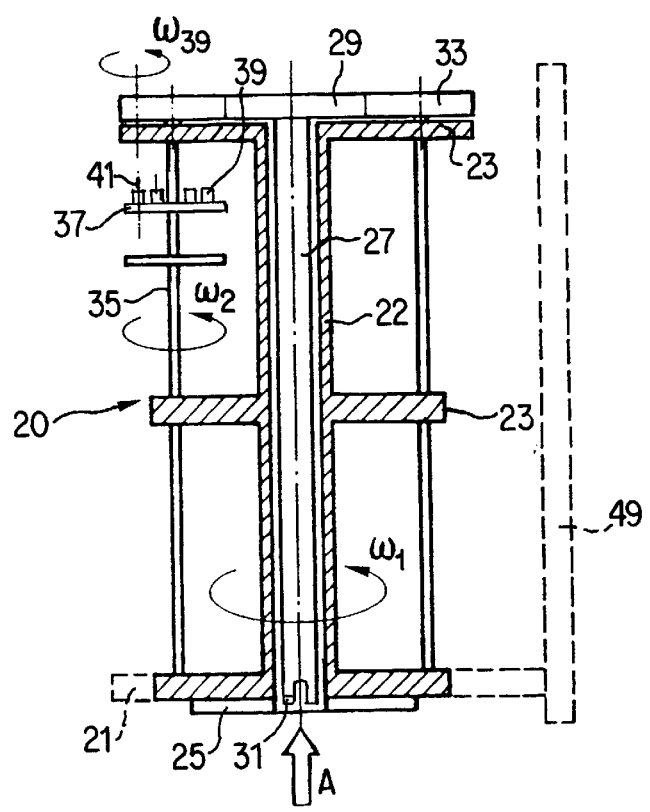
FIG. 2 is a view analogous to FIG. 1 of a second type of a workpiece holder preferably used on an installation according to the invention.

If, as customary in technical jargon, the structure with a central shaft 7 or drive shaft 7 or 35 and holder plates 5 or 37 projecting thereon, is called a workpiece holder "tree", the above-mentioned workpiece holders may have one (FIG. 1) or several workpiece trees (FIGS. 2, 14). In this case, a large-space rotating movement is implemented, corresponding to $\omega_{140}$ or $\omega_1$ of the small trees about an axis of the workpiece holder, and/or a rotating movement of the small trees about their own axis, corresponding to $\omega$ or $\omega_2$ of FIG. 1, 2, or $\omega_{146}$ of FIG. 14, and/or a still smaller-space rotating movement of the workpieces about themselves, as indicated by $\omega_{10}$ of FIG. 1 and $\omega_{39}$ of FIG. 2.

All embodiments have in common that, as indicated at A in FIGS. 1, 2 and 14, a rotary drive transmission must take place onto the workpiece holders. In the following, workpiece holders, which as a unit are rotationally driven by a drive transmission from the stationary station, which workpiece holders are constructed, for example, according to FIG. 1, 2 or 14, are called a rotary magazine.

When charging or discharging workpieces on rotary magazines, it is customary to leave the rotary magazines coupled to the processing station. This takes place because of signal-related connections, for example, of the motor drive, of electric signals for biassing the workpieces, of cooling medium lines, etc. As will also be illustrated in the following, the multi-station installations on which the present invention is based under one aspect are designed for handling rotary magazines as a whole corresponding to a batch processing. Based on the above, the problem must therefore be solved of implementing the mechanical rotary coupling according to A, as well as optionally also an electrical signal coupling, particularly for biassing the workpieces, to the rotary magazines, which rotary coupling permits the handling of the above-mentioned rotary magazines as a whole, and in this case, particularly also their charging and discharging. The coupling must be suitable to be automatically established and released. If, for example, with a view to a rotary magazine according to FIG. 14, the time relationships are taken into account which are required for charging this rotary magazine with workpieces individually, if it remains coupled to an installation station, the advantage is easily obtained which is significant with respect to installation stoppage times and passage, of being able to handle the above-mentioned rotary magazines as a whole, that is, transport them and charge and discharge them as a whole.

Figure 15:
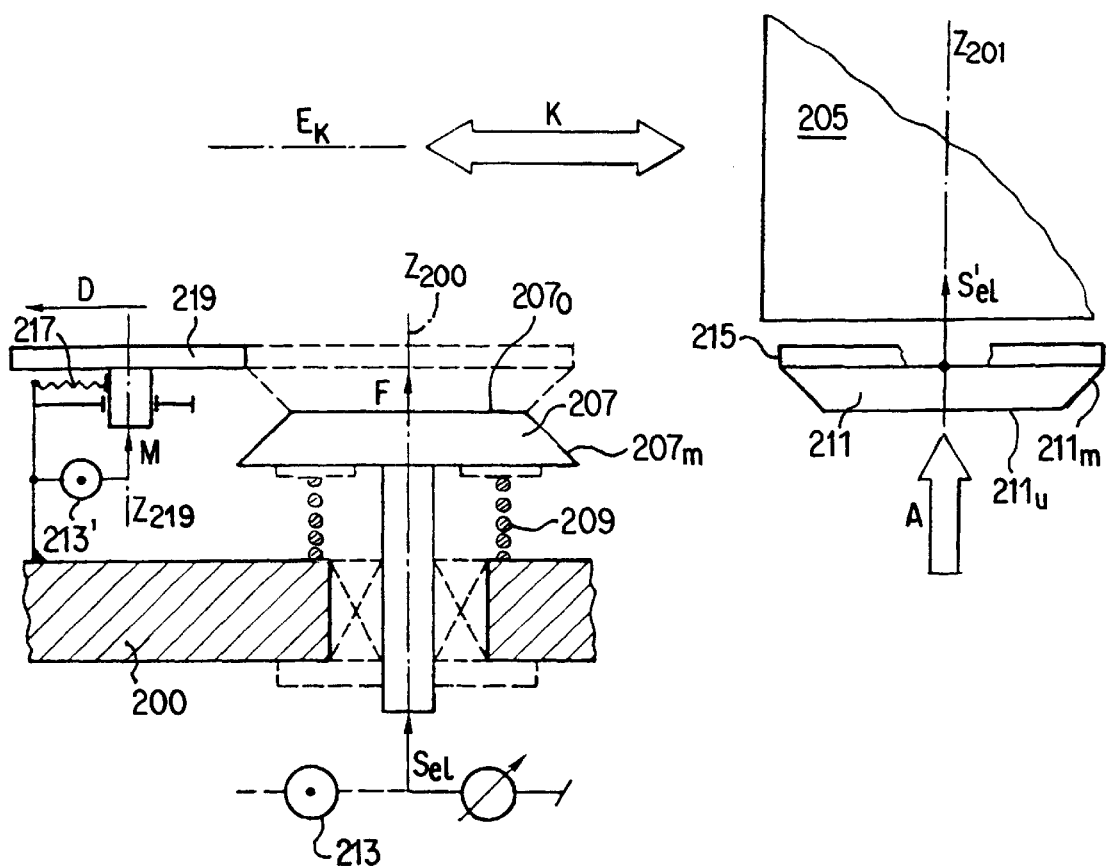
FIG. 15 is a schematically simplified view of a preferred coupling device for mechanical and/or electrical signals between a processing station and workpiece holders introduced therein for processing.

FIG. 15 illustrates a preferred embodiment of an electric and/or rotary drive coupling, basically acting between stationary installation parts and a rotary magazine handled as a whole.

A truncated-cone wheel 207 is provided on a wall portion 200 of a vacuum processing station, with respect to a station axis $Z_{200}$—corresponding to the position in which the axis of rotation $Z_{201}$ of a rotary magazine 205 to be moved in is to be positioned.

At least the small cone face $207_o$ is electrically conductive, preferably also the truncated-cone surface area $207_m$. The truncated-cone wheel 207 as a whole is preferably made of an electrically conductive material.

The truncated-cone wheel 207 is acted upon by the electrical signal $S_{e1}$, corresponding to a voltage to be imposed on the workpieces at the rotary magazine 205. A pressure spring arrangement 209 tensions the conical gear wheel 207 toward the outside according to arrow F.

For example, also for taking over the rotary drive A analogously to FIGS. 1, 2, 14, the schematically illustrated rotary magazine 205 has a truncated-cone wheel 211 which is fastened or rotationally disposed on the magazine 205 (depending on the constructional shape of the rotary magazine), on which truncated-cone wheel 211 at least the smaller face $211_u$, preferably also the truncated-cone surface area $211_m$, is manufactured of electrically conductive material. Preferably, the whole truncated-cone wheel 211 is again made of an electrically conductive material. As illustrated schematically by $S'_{el}$, an electrical connection exists from the truncated-cone wheel 211 finally to the workpieces on the rotary magazine 205.

For establishing and correspondingly for releasing the electrical coupling between the signal paths for $S_{el}$ and $S'_{el}$, the rotary magazine 205 is moved in the coupling/uncoupling direction marked by the letter K, preferably in a plane, and further preferably, linearly, such that the surface area 211m abuts on the surface area $207_m$; whereupon, by the further movement of the rotary magazine, the conical gear wheel 207 is restored against the force of the spring 209 and, only by way of the surface areas, then finally by way of the small cone faces $207_o$ and $211_u$, the electrical coupling will be established. The coupled-in position of the truncated-cone wheel 211 is illustrated in FIG. 15 by a broken line.

Up to now, only the approach for establishing the electrical coupling was discussed. Different situations are now conceivable with respect to the relative rotating movement of the conical gear wheels 207 and 211:

If the rotary magazine 205 is caused to rotate with respect to the truncated-cone wheel 211 differently than indicated in FIG. 15 by arrow A, and the conical gear wheel 211 is therefore freely rotatably disposed on the rotary magazine 205, the truncated-cone wheel 211 remains stationary on the truncated-cone wheel 207, and acts only as a transmission contact element.

If the truncated-cone wheel 211 is to be caused to rotate corresponding to arrow A and thus at least parts of the rotary magazine 205 are to be caused to rotate, this can take place in that the truncated-cone wheel 207 spring-tensioned on the station wall 200 is rotatably disposed and is driven by a driving motor 213 (illustrated by a broken line). The contact surfaces of the wheels 207, 211 in this case are preferably profiled and act as drive-transmitting adhesive surfaces.

If, in the position of the truncated-cone wheel 211 indicated by a broken line, its drive, which will be explained in the following, is not established by way of truncated-cone wheel 207, two situations are again conceivable: Either the wheel 211 slides on the non-rotatable wheel 207, or—preferably—the wheel 207 is constructed as a free wheel and rotates, together with the driven wheel 211 in the position indicated by a broken line, about the axis $Z_{200}$.

A separation of the rotary drive transmission function and the electrical signal transmission function between the truncated-cone wheels 207 and 211 is preferred. This is implemented in a preferred embodiment as further illustrated in FIG. 15. The truncated-cone wheel 211 carries a driving crown 215 constructed as a toothed crown or as a friction contact crown. When the truncated-cone wheel 211, together with the driving crown 215 and the rotary magazine 205, is moved into the coupling position against the axis $Z_{200}$ according to K, the driving crown 215 comes in contact with a station-side driving wheel 219. The driving wheel 219 is rotatably disposed with respect to the station wall 200 about the axis $Z_{219}$, in which case the axis $Z_{219}$ can be displaced by a schematically illustrated spring arrangement 217 in a spring-tensioned manner in parallel to the moving plane $E_K$ and in the direction of the rotary magazine movement K. During the establishment of the coupling, the driving crown 215 therefore comes in contact with the driving wheel 219 and presses the driving wheel 219 in the indicated direction D against the force of the spring arrangement 217. This establishes the driving coupling. Corresponding to the driving crown 215, the driving wheel 219 is constructed as a frictional wheel or preferably as a gear wheel. It is driven, optionally by way of a transmission, by a driving motor 213', as indicated by the signal M, and drives the truncated-cone wheel 211 by a frictional or toothed contact. In this case, when stationarily installed with respect to the wall 200, the truncated-cone wheel 207 can frictionally ensure the electric contact or is preferably constructed as a free wheel freely rotating with the truncated-cone wheel 211.

By way of the coupling arrangement illustrated in FIG. 15, it becomes possible, in multi-station installations of the type described in the following, but also in individual station installations, to transport workpiece rotary magazines, such as 205 of FIG. 15, as a whole, from one station to another, to charge and discharge them and to automatically establish or release in the process the required mechanical and/or electrical coupling.

In all installation configurations described in the following, the problems of the coupling to the correspondingly provided rotary magazines and workpieces holders was preferably solved as explained by reference to FIG. 15.

As also explained in FIGS. 1 and 2 by use of a broken line, but also implementable on the workpiece holder according to FIG. 14, one support plate 21 respectively and particularly the sealing plate 49, which will be described in the following, are connected with the workpiece holders 1 and 20 and generally with the rotary magazines 205 according to FIG. 15 such that the workpiece holders are rotatably movably disposed on the support plates 21. As will be demonstrated, as a result, a workpiece holder arrangement is created which simultaneously permits the separating of the processing stations in each case charged therewith, with the sealing plate 49, with respect to the process from the distribution station and generally permits the closing of a station opening serviced by a workpiece holder with respect to the process.

In the following figures, that is, in all installations according to the invention introduced in the following, workpiece holders of the type illustrated in FIG. 1 and/or FIG. 2 and/or FIG. 14 and rotary magazines 205 of the illustrated types can be used.

Figure 3:
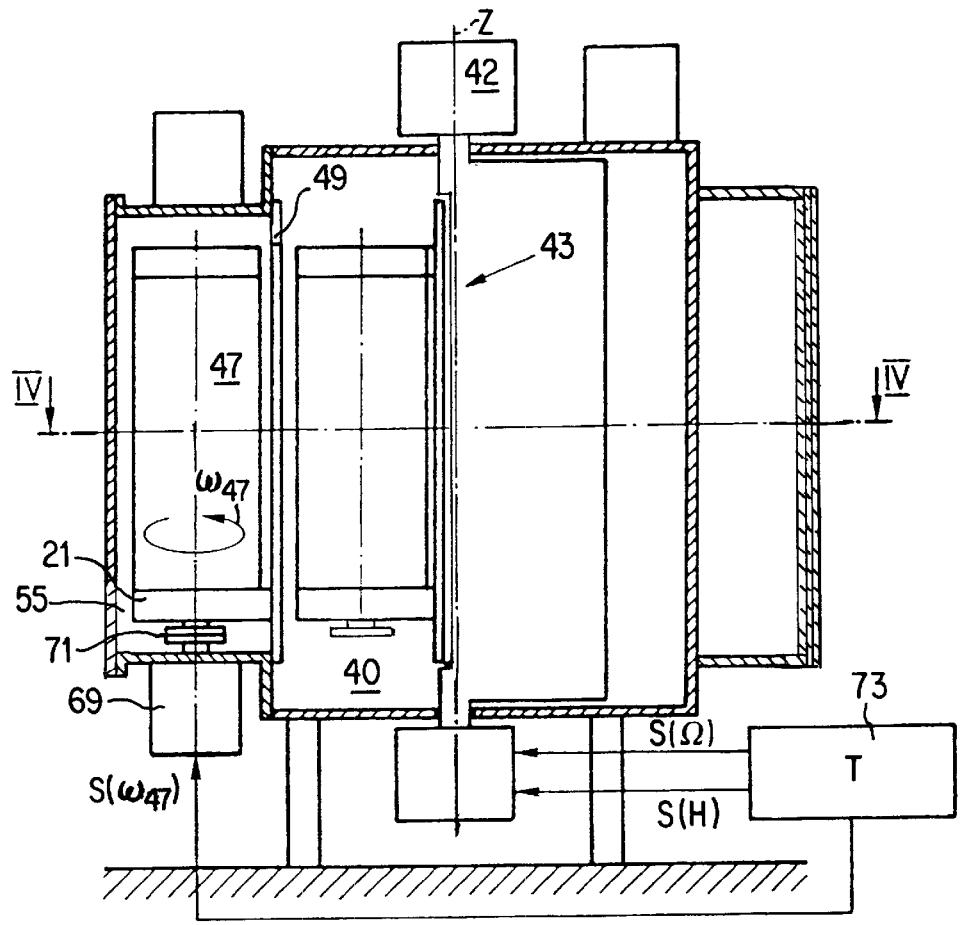
FIG. 3 is a schematic longitudinal sectional view of a first embodiment of an installation according to the invention.
Figure 4:
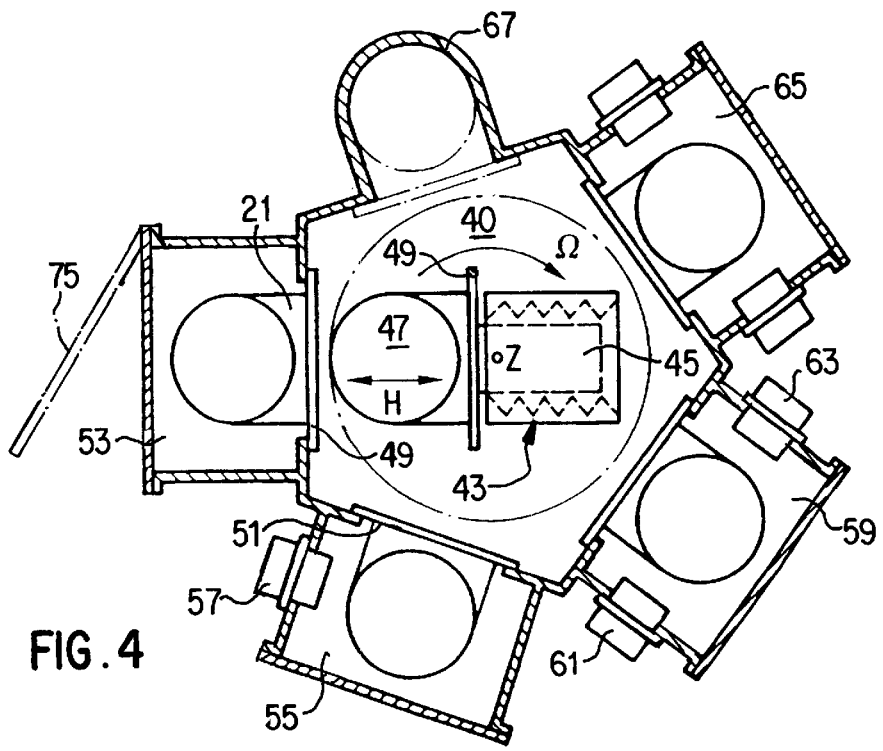
FIG. 4 is a cross-sectional view along line IV—IV of the installation according to FIG. 3.

The installation illustrated in FIGS. 3 and 4 has a central distribution station 40. In the distribution station 40, a robotic transporting device 43 is provided which is rotatable about a central axis Z by way of a drive 42. As illustrated in FIG. 4, the robotic transporting device 43 has an arm 45 which can radially moved out with respect to the axis Z and which, as required, is encapsulated in a bellows-type manner with respect to the environment in the distribution station. The arm 45 can in each case transport a cylindrical workpiece holder 47 which is constructed corresponding to the principle of FIG. 1, 2 or 14. In the embodiment illustrated here and, as illustrated particularly in FIG. 3, the sealing plate 49 (FIGS. 1, 2) is arranged on the workpiece holder 47 and is transported as a unit together with the workpiece holder 47 on a rotating movement $\omega_{47}$. At least one inward/outward transfer station 53 or at least one inward and one outward transfer station are flanged to operating openings 51 on the distribution station 40 which are aimed at the horizontal lifting plane of the arm 45, as well as processing stations, in this case preferably at least one coating station, such as a sputtering station 55 with a sputtering source 57, another sputtering station 59 with two sputtering sources 61 and 63, another 65 and a cooling station 67.

In FIG. 4, the stations 53, 55, 59 and 65 are charged while the station 67 has just been discharged.

It is illustrated that, in this installation configuration, as long as a workpiece holder 47 is deposited in a respective station, simultaneously, by way of the sealing plate 49, the corresponding opening 51 to the distribution station 40 is shut off.

As illustrated in FIG. 3, particularly in the case of stations with a targeted processing effect, as, for example, in the case of the sputtering stations 55 and/or 59 and/or 65, one rotary drive 69 respectively with a drive coupling 71 is provided in order to cause, as explained by reference to FIG. 1, 2 or 14, at least parts of the workpiece holder 47 to rotate. The coupling technique explained by way of FIG. 15 is preferably used.

As further illustrated in FIG. 4, as the result of the removal of the workpiece holder 47 formerly processed therein, the station and therefore simultaneously the sealing wall 49 are open with respect to the distribution station 40.

Furthermore, a time control unit 73 is provided on the installation which, among other things, controls the rotating movement of the robotic transport device 43 corresponding to $S(\Omega)$, the lifting movement of the transport arm 45 corresponding to $S(H)$ and the rotating movement of the workpiece holder 47 corresponding to $S(\omega 47)$. For the depositing of wearing protection layer systems, wearing protection layer materials are applied at the coating stations, such as the sputtering stations illustrated in FIGS. 3 and 4, in each case by PVD or PECVD coating processes. In this case, the PVD coating processes can be carried out as reactive processes, for the purpose of which reactive gas is fed to the corresponding stations from a gas supply. However, they can also be implemented non-reactively. For depositing wearing protection systems, the working cycle takes place in the sequence indicated by $\Omega$ in FIG. 4, controlled by the unit 73; that is preprocessing in station 67 and subsequent etching—reactive or non-reactive—and coating, reactive or non-reactive.

Figure 5:
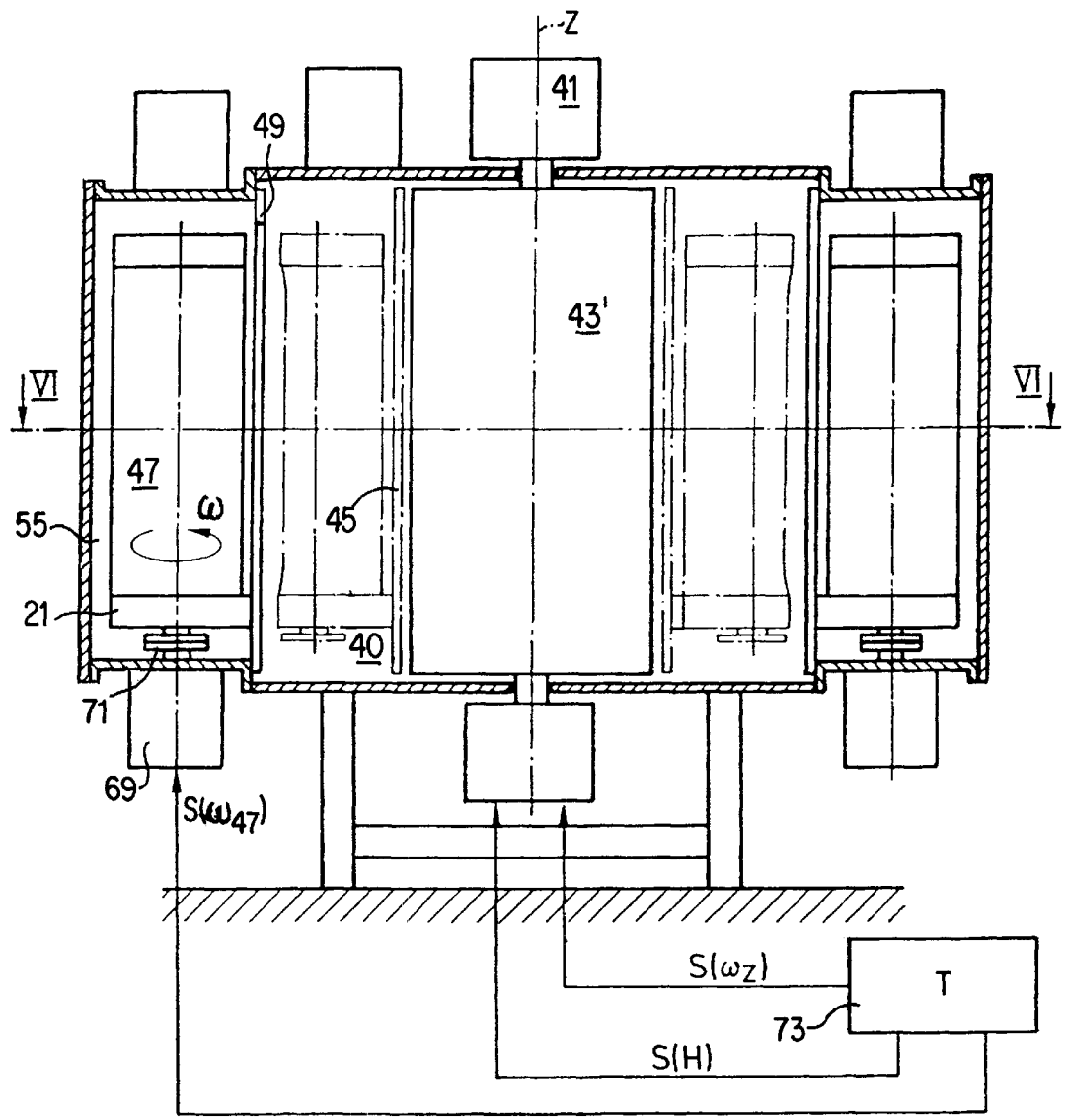
FIG. 5 is a schematic view analogous to FIG. 3 of the construction of another embodiment of an installation according to the invention.
Figure 6:
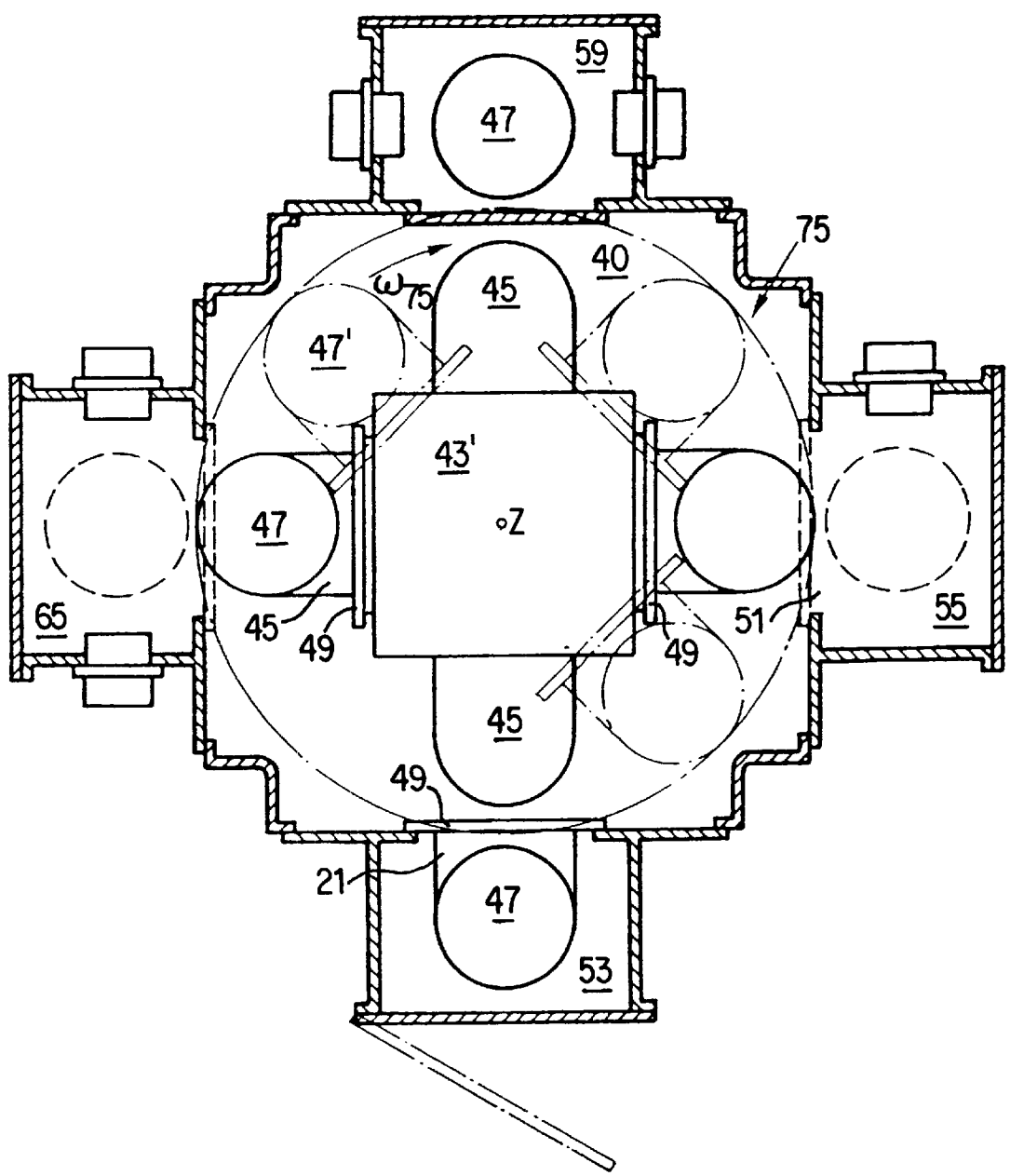
FIG. 6 is a sectional view analogous to FIG. 4 along line VI—VI of the installation according to FIG. 5.

FIGS. 5 and 6 illustrate another installation configuration according to the invention, which requires no further significant explanation for a person skilled in the art after the explanations concerning FIGS. 3 and 4. Parts already explained by FIGS. 3 and 4 have the same reference numbers. The difference between the installation according to FIGS. 5 and 6 and the installation according to FIG. 3 and 4 is the fact that the robotic transport device 43' according to FIGS. 5 and 6 has several transport arms 45 and can therefore service the stations provided at the central distribution station 40 with an increased timing frequency. The control unit 73 controls the rotating movement of the device 43' corresponding to $S(\omega_z)$ In this case, by way of the time control unit 73, the several arms 45 (see FIG. 6) provided on the robot 43' can be moved out and moved back preferably in an arbitrary input sequence.

For example, in FIGS. 5 and 6, the stations 53 and 59 are in each case charged with workpiece holders 47 and are ready to operate and are sealed off by the plates 49, while the stations 65 and 55 are just being discharged or charged. However, often a synchronous simultaneous operation of the stations may be desired.

Particularly FIG. 6 also shows another implementation possibility. Here, the robotic transporting device 43' may be rotatable in a controlled manner about the axis Z, as described above, or it may be stationarily arranged in the distribution station 40. In the latter case, the transport of the workpiece holders 47 takes place in the distribution station 40 as described at 47' by a carrousel, in each case in the alignment position to one of the arms 45 and one of the openings 51. By way of the arms 45, only the transport movement radially from the carrousel in and out of the stations back to the carrousel is implemented. The rotating movement of a carrousel 75 provided in this manner is indicated in FIG. 6 by $\omega_{75}$. An even higher flexibility of the station operation is achieved when a carrousel 47' and a robot 43', which can be rotated about Z, are used.

Figures 9, 10:
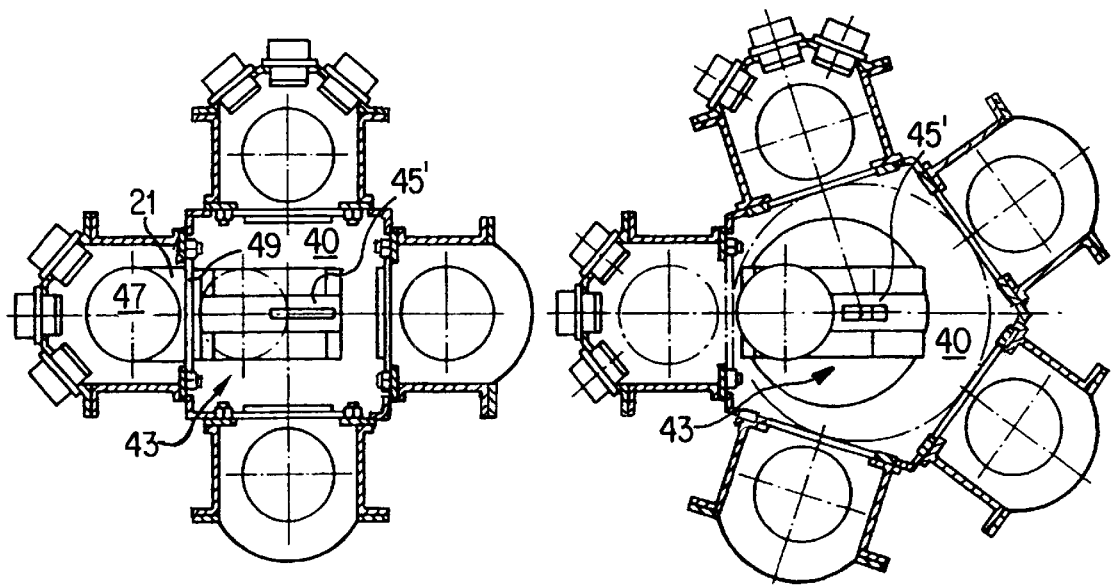
FIG. 9 is a sectional top view of a four-station installation constructed according to the principle illustrated by FIGS. 7 and 8.
FIG. 10 is a view analogous to FIG. 9 of a five-station installation according to the invention.

FIGS. 7 to 10 show another installation according to the invention; in FIG. 9, in the configuration with four stations flanged to the distribution station 40; in the configuration according to FIG. 10, with five such stations. The construction and the method of operation of the installation illustrated here will again be clearly understandable based on the above for a person skilled in art. The same reference numbers as those used in FIGS. 3 to 6 are again used for the same parts and assemblies. The important difference of the installation illustrated in FIGS. 7 to 10 is the construction of the radial lift transport element provided on the central robot 43.

Figures 7, 8:
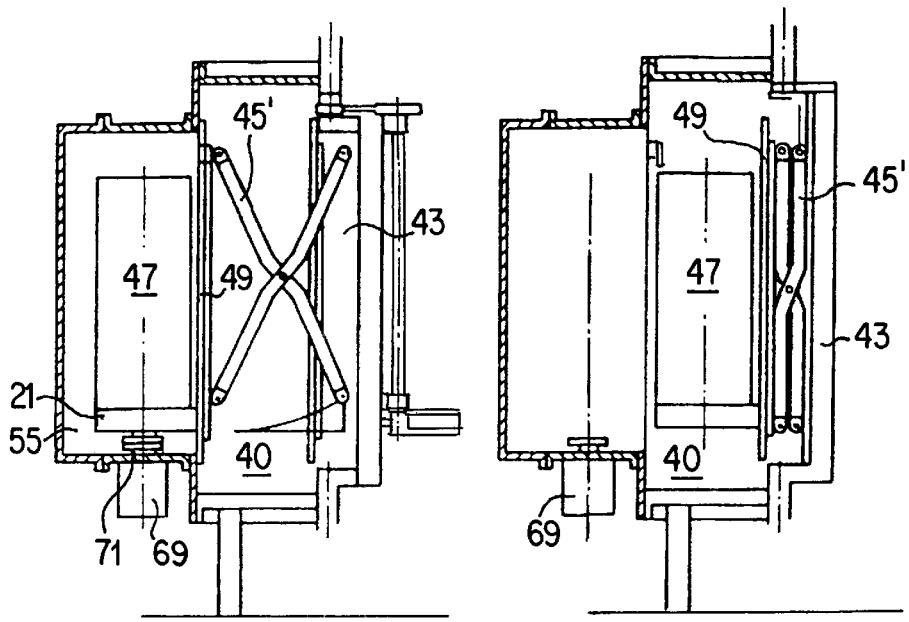
FIG. 7 is a partial longitudinal sectional view of another embodiment of an installation according to the invention with a workpiece holder introduced into a processing station.
FIG. 8 is a view according to FIG. 7 of the installation with a workpiece holder returned into the distribution station.

As illustrated particularly in FIGS. 7 and 8, in the configuration according to FIGS. 3 and 4, one shears-type mechanism lever arrangement 45' is provided on the central robot 43 and, in a configuration according to FIGS. 5 and 6, several shears-type mechanism lever arrangements 45' are provided on the central robot 43, in order to transport the workpiece holders 47 with the sealing plates 49 toward and into the respective processing stations and out of these processing stations. In FIG. 9, the mechanism 45' has moved out; in FIG. 10, it has returned, analogous to FIGS. 7 and 8.

Figure 11:
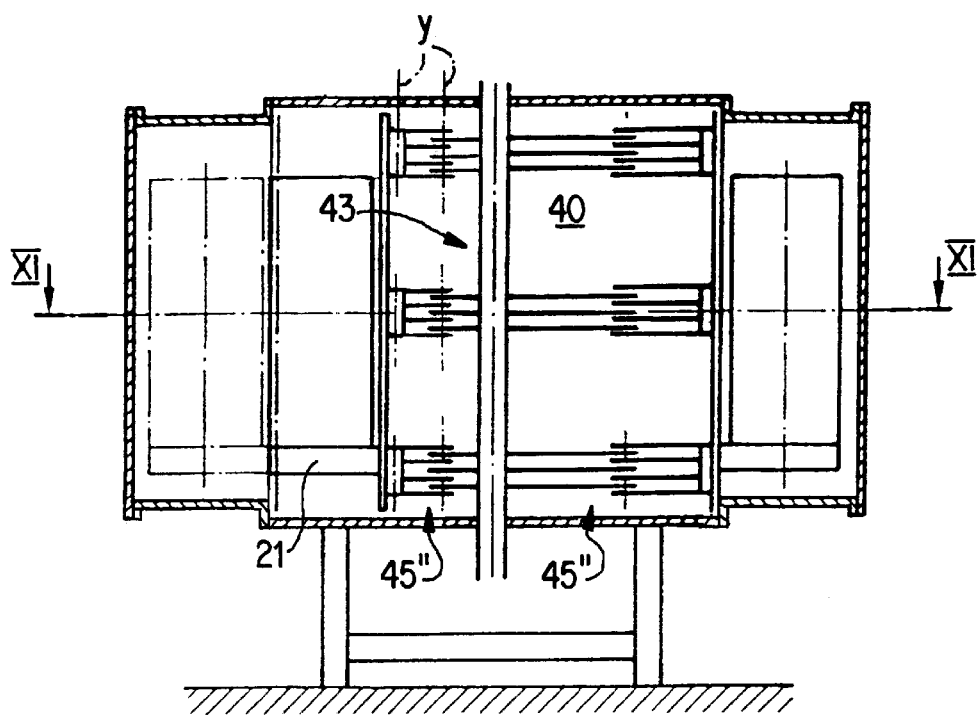
FIG. 11 is a schematic longitudinal sectional view of another installation according to the invention.
Figure 12:
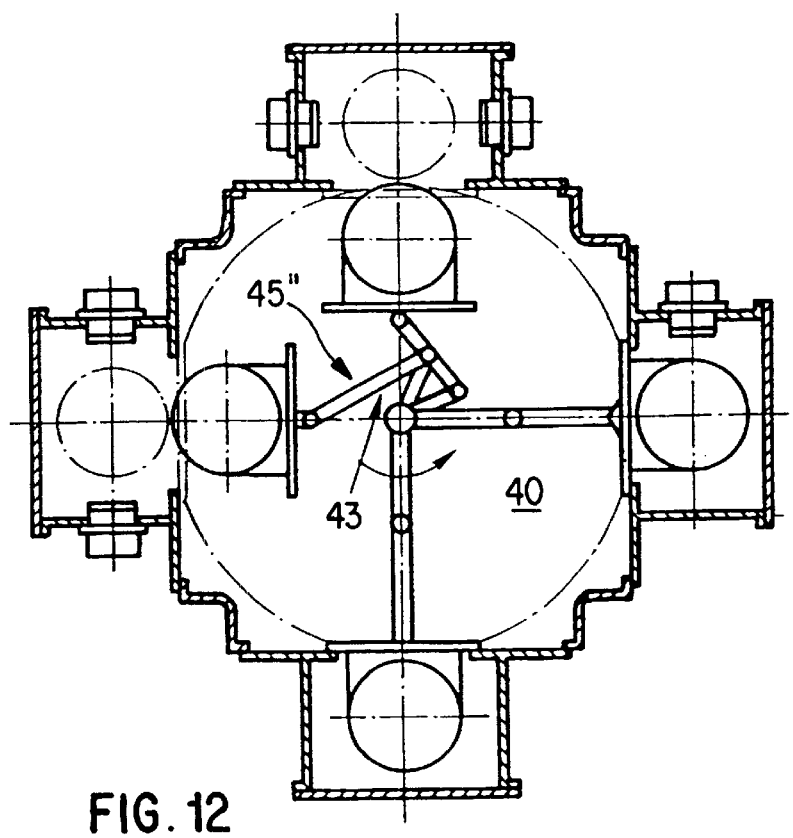
FIG. 12 is a cross-sectional view of the installation of FIG. 11 along line XI—XI of FIG. 11.
Figure 13:
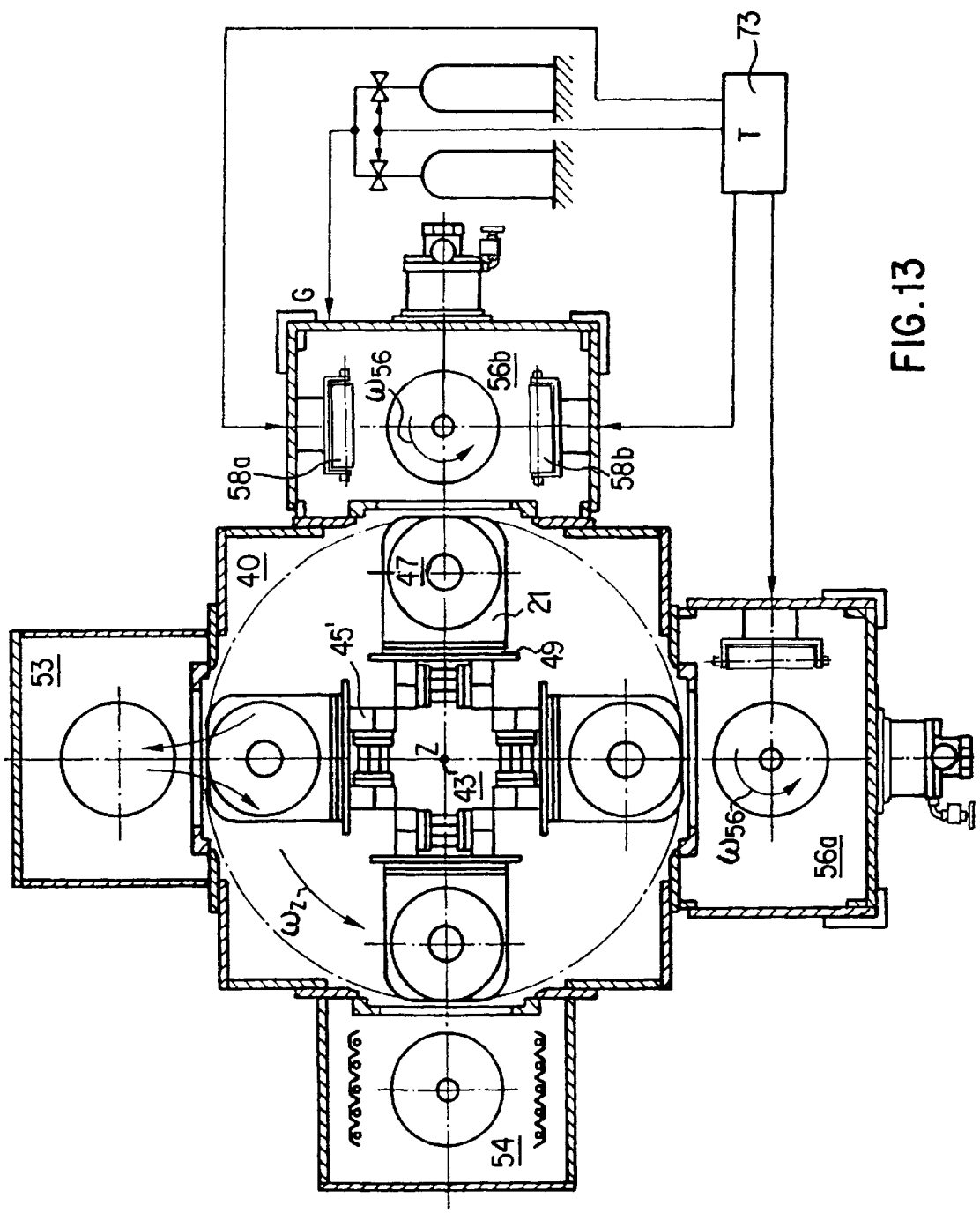
FIG. 13 is a longitudinal sectional view of another embodiment of the installation according to the invention, essentially constructed like the installation according to FIGS. 7 to 10.

Instead of transport arms 45, which can be moved out in a linearly radial manner, as provided on the installations according to FIGS. 3 to 6, or of radial moving-out elements in the form of shears-type mechanisms, as provided according to FIGS. 7 to 10 and also according to FIG. 13, additional lifting element structures may be provided, as illustrated, for example, on the installation according to FIGS. 11 and 12, where the radial lifting elements 45'' are implemented by multi-arm lever arrangements which can mutually be swivelled about vertical axes Y. Apart from the above-mentioned radial-lift mechanism, the construction of the installation according to FIGS. 11 and 12 corresponds to the construction of the installations described by reference to FIGS. 3 to 10.

FIG. 13 illustrates the configuration of a system which, virtually as a minimal configuration, is particularly suitable for the depositing of a wearing protection layer system on workpieces, particularly on tools for cutting operations, or on machine construction elements.

In the distribution station 40, the installation according to FIG. 13 has a robotic transporting device 43' which can be rotated about the central axis Z and has four shears-type mechanism lifting arms 45' constructed as illustrated in FIGS. 7 and 8. The workpiece holders 47 are transported together with the lifting plates 21 and sealing plates 49, are deposited in the provided stations and are returned from the latter. An operating or transition station 53, a preprocessing—particularly heating station 54—and at least one, in the illustrated example, two coating stations 56a, 56b are provided. The processing cycle preferably takes place in the direction indicated by $\omega_z$. Here also, a time control unit 73 is provided which was introduced in FIGS. 3 and 5 and which, optionally in a freely programmable manner, controls the operations of the installation which depend on one another with respect to time. Particularly in stations 56a and 56b, the workpiece holders 47 are caused to rotate, as illustrated by $\omega_{56}$; preferably, as explained reference to FIG. 2, the workpiece supports for the workpieces are also caused to rotate which are disposed on these workpiece holders 47.

Figure 16:
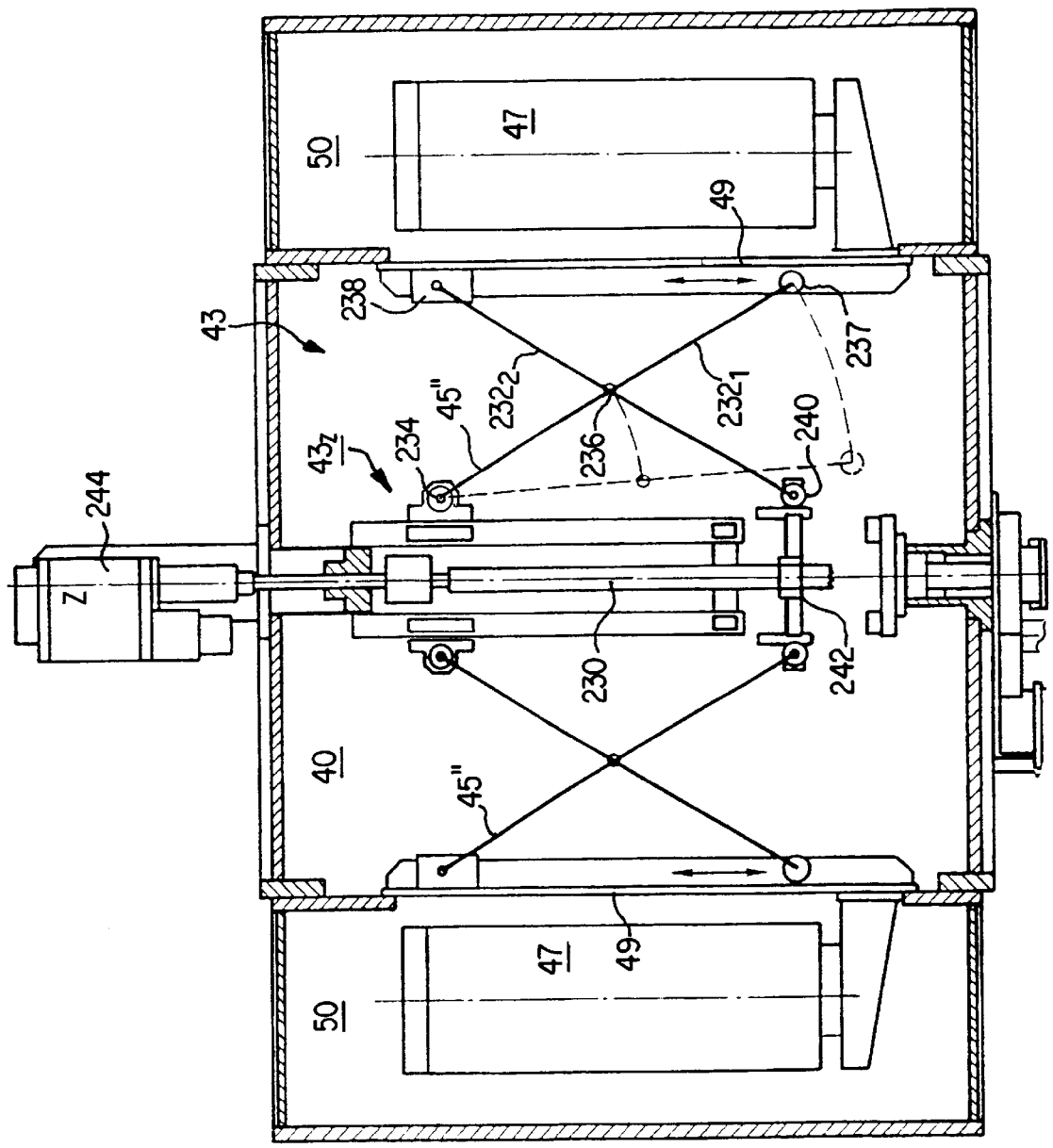
FIG. 16 is a partially simplified and schematic view analogous to FIG. 7 of a preferred embodiment of an installation according to the invention with a shears-type mechanism transport drive for workpiece holders.
Figure 17:
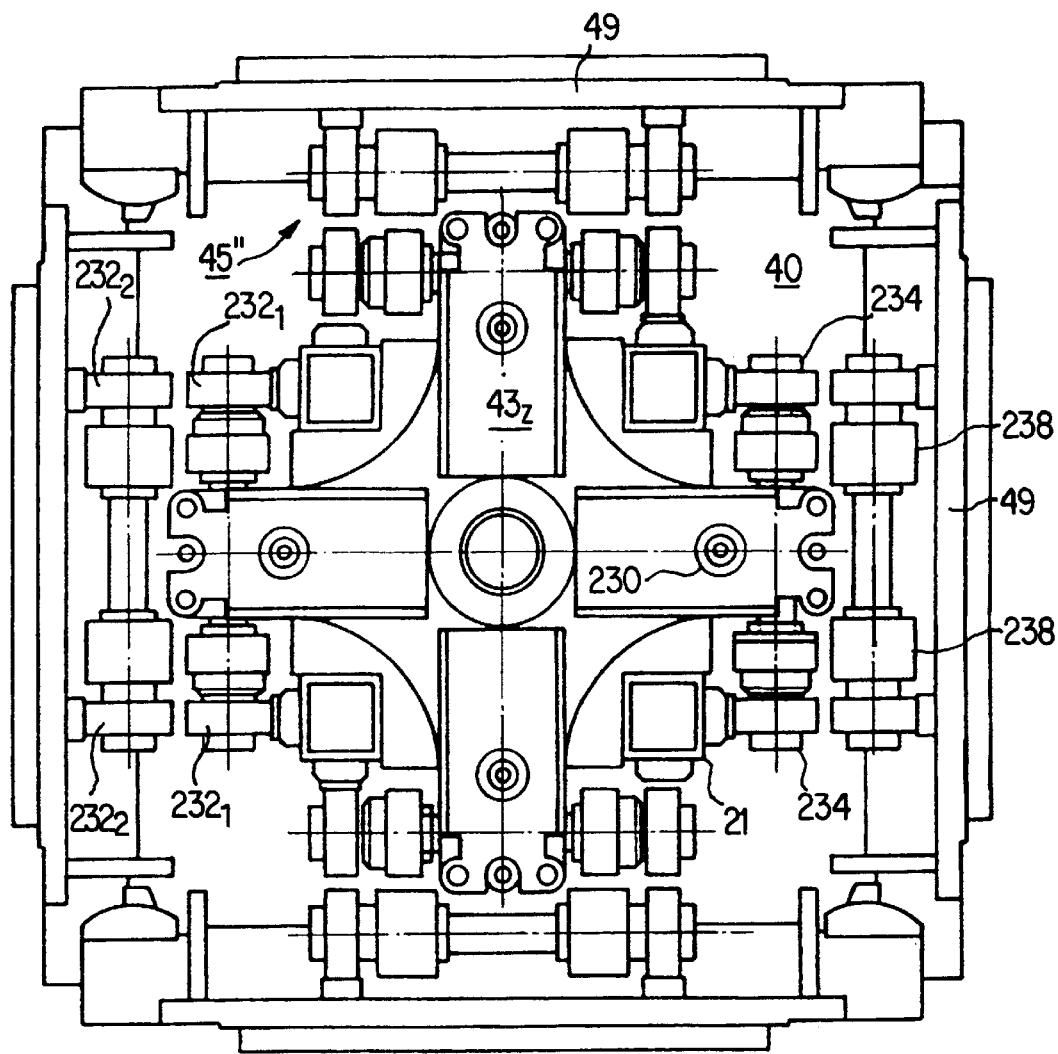
FIG. 17 is a partially sectional top view of the installation illustrated in FIG. 16.
Figure 18:
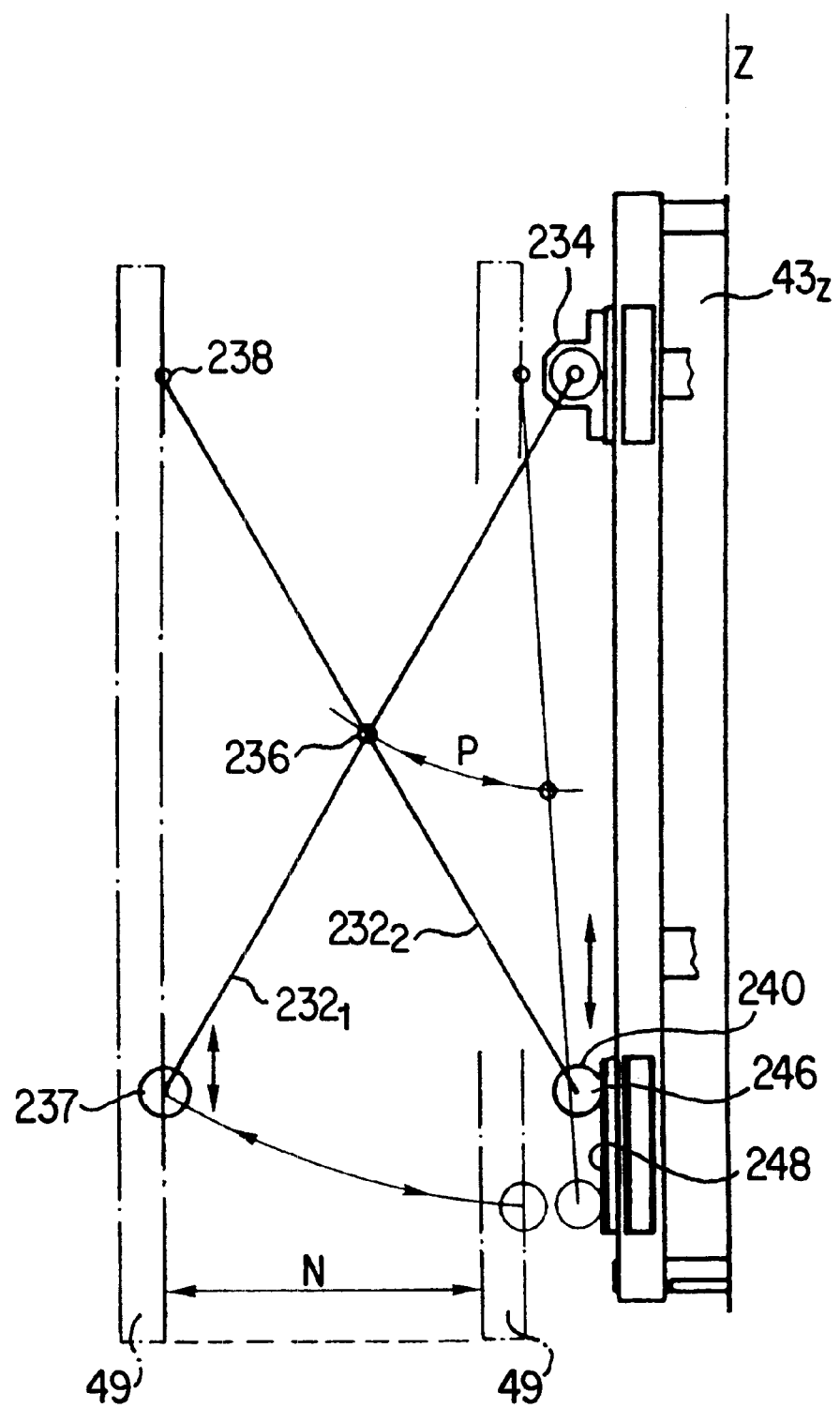
FIG. 18 is a basic diagram of another preferred embodiment of a shears-type mechanism drive for workpiece holders in the distribution station.
Figure 19:
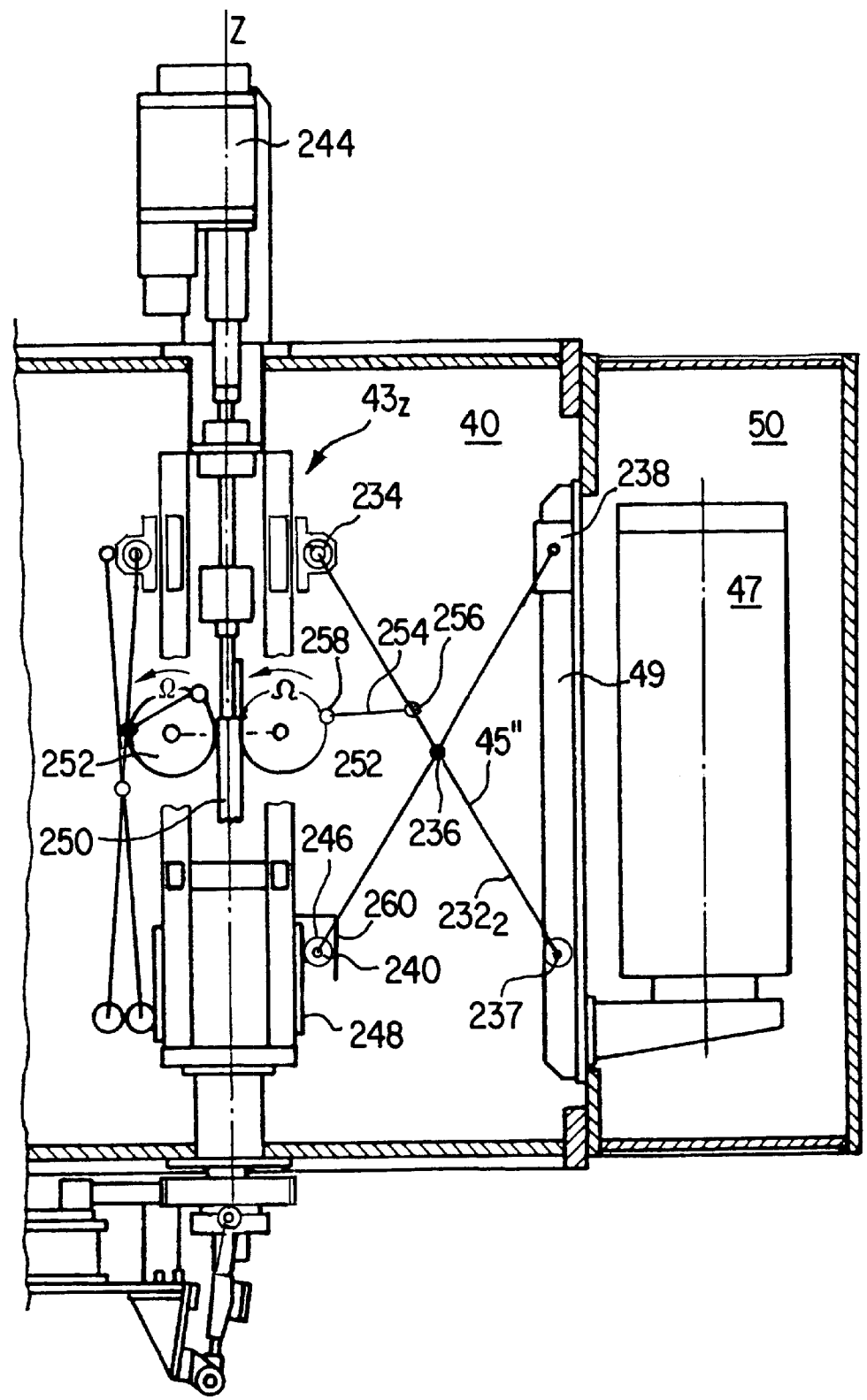
FIG. 19 is a simplified and partially schematic view based on the explanation of FIG. 18 and analogous to FIG. 7 of an installation according to the invention having the shears-type mechanism drive according to FIG. 18.
Figure 20:
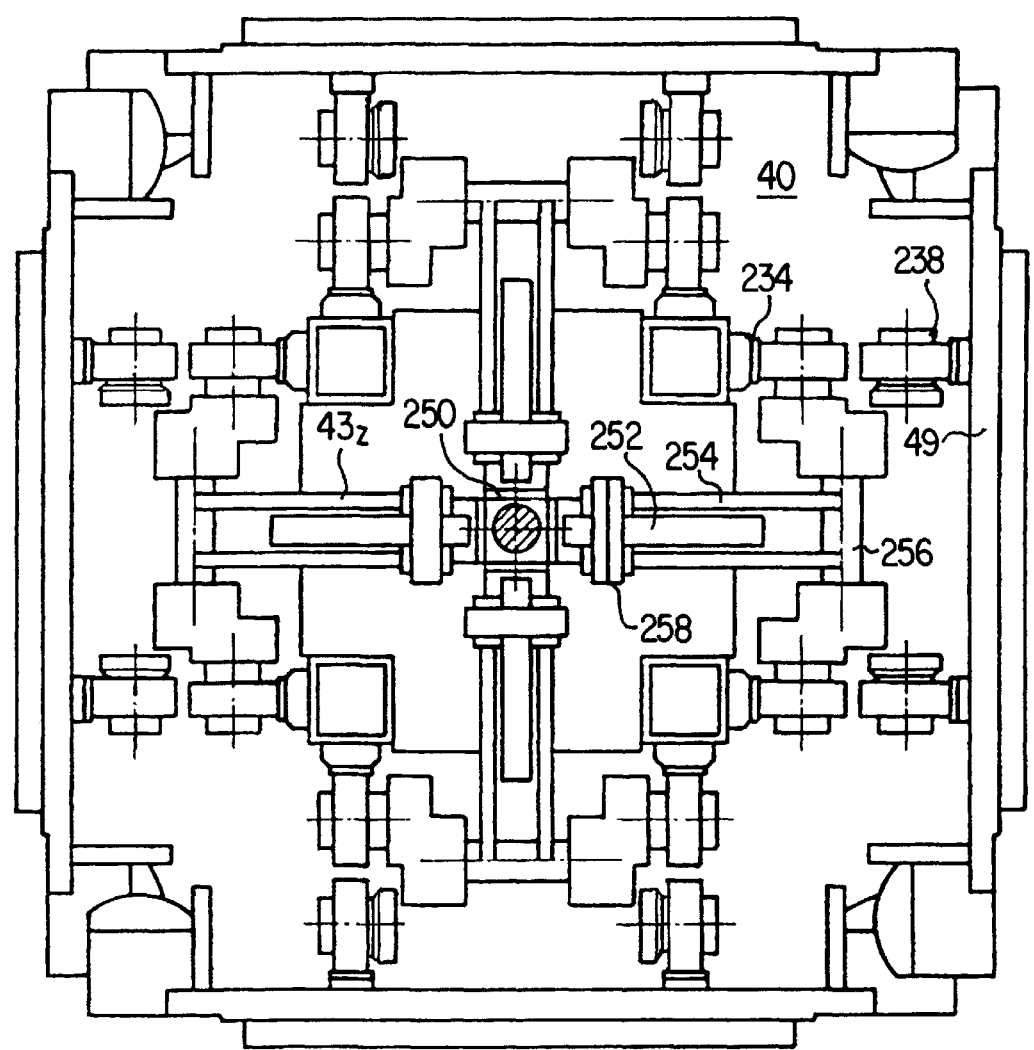
FIG. 20 is a partially sectional top view analogous to FIG. 17 of an installation constructed like the installation explained by way of FIG. 19.

On the basis of FIGS. 16 and 17, on the one hand, and of FIGS. 18 to 20, on the other hand, two preferred embodiments of the shears-type mechanism drives 45' are introduced on installations as they were explained in principle in FIGS. 7 to 10. The same reference numbers are used for parts already described in FIGS. 7 to 10.

Workpiece holders 47 with the assigned sealing plates 49 are provided on the central robot part $43_z$ by way of one shears-type mechanism lever arrangement 45'' respectively. In connection with FIGS. 16 to 20, mainly the implementation and the drive of the shears-type mechanism lever arrangements 45'' is of interest. Installation parts which are not affected by the latter will therefore not be described in greater detail in this context.

Corresponding to the number of provided stations, generally indicated by 50, shears-type mechanism lever arrangements 45'' are provided on the central part $43_z$ of the robot 43 which is disposed in a driven manner to be rotatable about the axis Z. While these shears-type mechanism lever arrangements 45'' are illustrated in a schematic lateral view in FIG. 16, they are, for reasons of clarity, shown in a more detailed fashion in FIG. 17 in a partially cut, cross-sectional representation.

A linear drive, for example, by way of a connecting rod or preferably by way of a spindle drive 230, is provided in the central robot part $43_z$ jointly for at least two shears-type mechanism lever arrangements or, preferably, individually for each of the provided lever arrangements.

A first lever $232_1$, which according to FIG. 17 is preferably constructed as a double lever, as illustrated in FIG. 16, is swivellably disposed at its upper end on the central part $43_z$ at reference number 234. Its lower end, preferably guided by up-and-down moving rollers 237, is situated on the sealing plate 49.

A second lever $232_2$ of the shears-type mechanism is swivellably disposed at reference number 236 with the first-mentioned lever 232, such that both levers 232, and $232_2$ have equally long legs between the central rotary bearing 236 and the respective end-disposed bearings. At its upper end, at reference number 238, the lever $232_2$ is swivellably disposed on the sealing pale 49, while its lower end, at reference number 240, is swivellably disposed on a carriage 242 driven up and down by means of the spindle drive 230 linearly along part $43_z$.

Driven by a drive 244, the respective spindle drive 230 for a shears-type mechanism lever arrangement 451'' is selectively started, whereby the carriage 242 is linearly lifted or lowered in the direction of the Z axis. Because of the identically long legs, in each case between the rotary bearing 236 and the end bearing points of the levers $232_1$ and $232_2$, it is ensured that the sealing plate 49 is moved out and returned parallel to the axis Z and linearly thereto.

In FIG. 16, the lever 232, is indicated by a broken line in that position in which the sealing plate 49 is completely lifted off and moved back. The circular path of the rollers 237 as well as of the bearing 236 are also indicated by a broken line.

The implementation of another drive variant is shown schematically in FIG. 19.

The swivel bearings 234 of the equal-leg arrangement 45" with the central swivel bearings 236 are again non-displaceably arranged on part 43$_z$. A linear drive, preferably in the form of a toothed rack or threaded rod 250, is provided for each shears-type mechanism lever arrangement 45" or for several lever arrangements 45" or for all lever arrangements 45" jointly. Each of the toothed racks 250 engages with the toothing of one assigned crank disk 252 respectively, which are each non-displaceably rotatably disposed on part 43$_z$. The crank disks 252 are each connected by transmission levers 254 with the respective levers 232$_2$, by way of swivel bearings 256 on the lever side and by way of swivel bearings 258 on the crank disk side. The swivel bearings 240 are formed by preferably guided rollers 246 which roll off along the rolling areas 248 on the central part 43$_z$. A lifting-off of the rollers 246 is prevented, for example, as schematically illustrated, by guides 260.

While the station 50 according to FIG. 19 on the right is closed off by the sealing plate 49 and the shears-type mechanism lever arrangement 45" has therefore moved out, the latter is returned in FIG. 19 on the left, in which case the station and the sealing plate are not shown there. By virtue of Ω, the respective rotating direction is indicated on the crankshafts 252, for swivelling these between the positions at which the shears-type mechanism lever arrangements 45" have completely moved in and completely moved out.

The favorable driving characteristics are the particular advantage of this shears-type mechanism lever drive; that is, the transmission ratio in the respective position of the shears is better adapted to the demand than in the case of the embodiment according to FIGS. 16 and 17. This results in a clear reduction of the required driving forces and therefore of the moment loads and transmitted forces, whereby the drive 244 can also be constructed at lower cost, optionally as a pressure cylinder which considerably reduces the control expenditures.

FIG. 18 schematically illustrates the movement of the shears-type lever mechanisms according to FIGS. 16 and 19. Whether they are driven by the linear drives, which according to the embodiment of FIG. 16 act upon the carriage 242 and thus upon the bearings 240, or by the drive according to FIG. 19, in the case of which the action takes place directly upon the swivelling angle of the levers 232$_1$, 232$_2$, in both cases, the bearings 234 are non-displaceably arranged on the central part 43. The bearings 240 are displaced linearly up and down parallel to the Z axis, whether they are driven by way of the carriage 242 in the embodiment of FIG. 16 or in a free-wheeling manner according to the embodiment of FIG. 19, which is illustrated in FIG. 18 by the rollers 246 and the rolling areas 248.

On the sealing-plate side, the bearings 238 are arranged in a non-displaceable manner, while the bearings 237 can again be displaced up and down, in the embodiment of FIG. 19 as well as in that of FIG. 16.

It is illustrated that the sealing plate 49 indicated in FIG. 18 by a dash-dotted line moves in parallel and linearly in and out in the direction N with respect to the axis Z.

If an excessive pressure difference of higher than approximately 4 mbar exists between the stations 50, which are connected to the central distributions station 40, and the latter, in addition to the drives for the sealing plate 49 described so far, an additional sealing protection is preferably provided. This will be explained by reference to FIG. 21.

The providing of this sealing protection is independent of the construction of the substrate holders as well as of the selected advancing mechanism and will therefore be explained separately.

Figure 21:
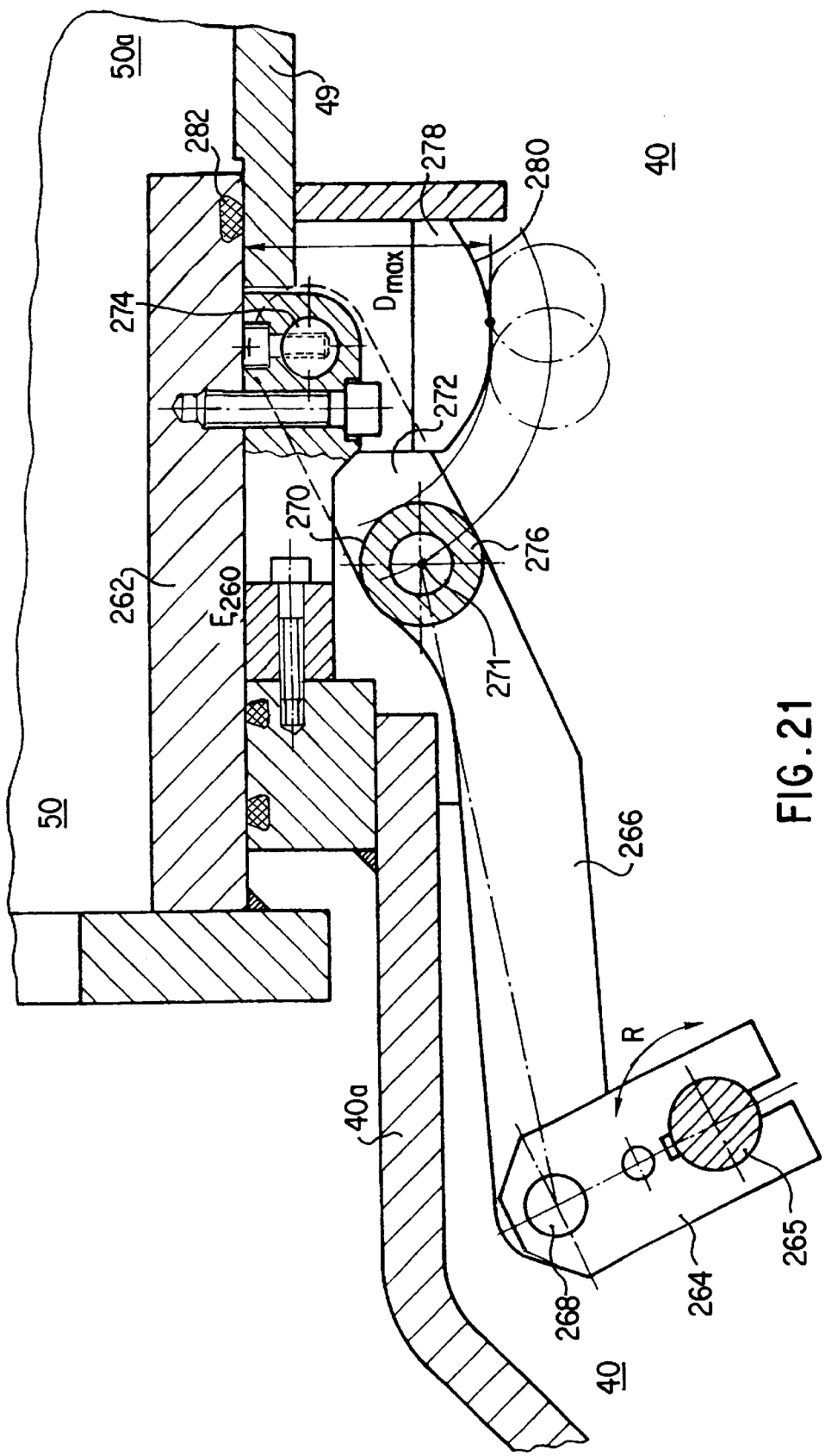
FIG. 21 is a cutout view of two vacuum installation stations coupled by way of an opening showing the implementation of a tensioning mechanism for ensuring the defined sealing pressure of a sealing plate placed against the opening in the process.

FIG. 21 illustrates a cutout of the wall 40a of the central distribution station 40. A station 50 is flanged thereto, such as a transition station, a coating station, a heating station, etc. The operating opening 50a of the station 50 is provided in an end plate 262 of the station 50.

A transmission lever 264 is disposed in a rotatingly driven manner about a shaft 265 on the distribution station. As illustrated by the double arrow R, it can be swivelled back and forth in a driven manner. Its end facing away from the shaft 265 is connected in an articulated manner on a bearing 268 with a transmission lever 266. The transmission lever 266, preferably constructed as a double lever, is swivellably disposed on another lever 272 at its end 270 situated opposite the bearing 268. The lever 272, in turn, is swivellably disposed on the connection plate 262 at reference number 274.

A contact pressure roller 276 is provided coaxially with the swivel shaft 271 between the levers 266 and 272.

A cam plate 278 is mounted on the sealing plate 49. The curved surface 280 of this cam plate 278 defines an increasing distance extending through a maximum $D_{MAX}$ with respect to the plane $E_{260}$ defining the opening 50a with respect to the station 40, and starting from the lever arrangement 266/272.

If the sealing plate 49 is placed by one of the above-mentioned transport techniques on a preferably provided seal 282 around the opening 50a, the lever 264 according to FIG. 2 is swivelled clockwise driven by a motor by way of the shaft 265, whereby the contact pressure roller 276 is driven by way of the curved surface 280 of the cam plate 278, as illustrated by a dash-dotted line. This takes place until immediately after the passing through the distance maximum $D_{max}$ with respect to the plane $E_{260}$. As the result, a high sealing contact pressure is reliably ensured between the sealing plate 49 and the edge of the opening 50a, which contact pressure also easily withstands in a sealing manner differential pressures of up to 1 bar. When the roller 276 has passed through the $D_{max}$ area, the drive to lever 264 can be stopped.

However, the roller 276 is preferably not driven beyond a dead center defined by $D_{max}$, particularly for reasons concerning wear and abrasion. In this preferred case, the drive acts permanently by way of the shaft 265 and thus, by an active and permanent tensioning, secures the required sealing force for the sealing plate 49.

Based on all introduced installation configurations but also with a view to a single-station installation, the sealing protection illustrated in FIG. 21 can be used wherever a sealing plate of any type must detachably and at a high contact pressure be placed on a passage opening between two stations operated at different pressures, at least one of which being a vacuum chamber.

In a minimal configuration for applying wearing protection layer systems, the installation comprises:
  the operating station 53,
    the preprocessing station 54 for heating the workpieces, for their exhalation or for the decomposition of impurities at the surface and finally for reaching the coating temperature required in the stations which follow.

The heating in station 54 can take place by radiant heating and/or by the electron current of a glow discharge or arc discharge generated in this station when workpieces are placed at an anodic potential.

Furthermore, the pretreatment in the station 54 may comprise an etching step, for example and preferably by sputter etching, during which the workpiece surfaces are exposed to an ion bombardment with argon ions, or metal ions during metal ion etching preferably by an arc source. The ion etching by Ar ions is preferred.

As a result, the metallic workpiece surface is freed of oxides or other contamination layers and is prepared for the subsequent coating.

Finally, in the above-mentioned minimal configuration, the preprocessing station 54 is followed by a coating station of the type illustrated, for example, in FIG. 13 by stations 56a and 56b, in which the sources required for the selected coating process are installed. As illustrated by the station 56b, several processing methods can be carried out, for example, coating processes carried out sequentially following one another by sources $58_a$ and $58_b$, and/or coating processes with etching processes connected in between. By guiding the potential particularly of the workpieces and the inlet control for different gases G into the process atmosphere, for example, by the change-over between the inlet of reactive gases and pure precious gases, a change-over can take place at one and the same processing station, for example, between sputter etching and sputter coating.

In addition to the above-described installation movements, the time control unit 73 also controls the implementation of the process, for example, by the intervention into the provided sources and/or gas feedings for the process gas G.

In a further preferred method of operation according to the invention in a four-station installation, as illustrated in FIG. 13, an operating station 53 is provided for the charging and discharging of the distribution station 40; a heating station 54 is provided in the case of which, in addition to the heating by means of radiant heat, an etching step is carried out, whereupon in a multi-function station of the type illustrated in FIG. 13 at reference number 56b, the additional processing takes place, specifically another etching by an Ar or metal ion bombardment for approximately 5 minutes; then a sputter coating or coating by means of an arc source with a metallic adhesive layer, preferably with chrome while using a magnetron source, which takes approximately 20 minutes; then the sputtering-on of an intermediate layer of tungsten carbide from a second magnetron source for approximately 30 minutes. Finally, in the fourth station, the function layer is implemented by the sputtering of tungsten carbide and the simultaneous admission of acetylene. In the case of this approach, with a view to FIG. 13 and the circulation direction $\omega_z$, the stations 56a and 56b are exchanged.

The installation according to the invention is used particularly for depositing wearing protection layers by PVD- or plasma-CVD processes.

In this case, the following wearing protection layers are preferably deposited:
  Hard-material layers, for example, made of TiN, TiCN, TiAlN, CrN and layer systems with several layers, for example, of the above-mentioned materials;
  friction-reducing layers, such as hydrogen-containing carbon layers and hydrogen-free carbon layers, carbon nitride, carbon silicon layers, carbon silicon oxide layers, metal carbon layers, metal carbide carbon layers, metal sulfide layers and layer systems with several layers, for example, of the above-mentioned materials.

In this case, the hard-material layers are preferably deposited on tools for removing material, such as drills and milling cutters, or for forming, such as molds and dies, at temperatures below 550° C.

In contrast, the friction-reducing layers are preferably used on precision components at temperatures below 250° C., such as components for drive assemblies, transmissions and pumps, but also—preferably in combination with a hard-material layer situated underneath—on tools for removing material or forming.

Examples of coating processes used according to the invention on the installation according to the invention:
  Sputtering of tungsten carbide and simultaneous admission of acetylene into the processing station for depositing tungsten carbide carbon layers;
  decomposition of acetylene by an HF plasma for depositing hydrogen-containing carbon layers.

In the above-mentioned plasma processes, pulsed DC-plasmas can also be used.
  Cathodic arc vaporizing of graphite targets for depositing hydrogen-free carbon layers.

In this case, during the arc vaporization, the plasma arc can be guided by a laser, in the sense of a combination of laser ablation and arc vaporization;
  reactive cathodic arc vaporizing of a hard-material layer, such as TiAlN, and subsequent application of a hydrogen-free carbon layer with cathodic arc vaporization of a graphite target for depositing a hard-material layer and a friction reducing carbon layer.

The following treatments take place, for example, at the installation according to the invention in the respective processing stations:

Station 1
  Charging and discharging of the substrates and pumping down to process pressure Station 2
  Preprocessing of the substrates, that is,
    heating of the workpieces for exhalation and decomposition of impurities at their surface and for reaching the coating temperature. The heating can take place by radiant heating or by electron bombardment from a plasma discharge, the substrates being switched as an anode with respect to the plasma.
  Ion bombardment of the workpiece surfaces, preferably with argon ions or with metal ions for etching the surface. The etching has the purpose of generating a metallic workpiece surface without oxidic or other bonding layers to which the layers which are subsequently applied will adhere sufficiently. The ions are generated in a plasma discharge.

Station 3
  Coating of the workpieces. This station contains the sources required for the selected coating process. Another etching step may precede the coating process in order to ensure sufficient adhesion of the wearing protection layer on the workpiece. In this case, part of the coating process can be carried out in another station 4 in order to increase the throughput at the installation according to the invention by shorter cycle times. Otherwise a station 4 is used for cooling the substrates before the aerating.

The installation according to the invention therefore comprises at least three processing stations. The workpieces in the central distribution station are displaced either synchronously from one station into the other or are distributed by way of an intermediate station individually to the processing stations.

The following is a particularly preferred embodiment for the operation of the installation according to the invention in a four-station configuration for the particularly preferred case of the depositing of a tungsten carbide carbon layer. During the operation of the installation according to the invention, it is basically endeavored to distribute the individual processing steps to respective processing stations such that the workpieces are processed essentially for an equally long time in each processing station in order to permit a synchronous timing of the installation and thus achieve an optimal throughput.

Station 1: Aerating, discharging of the already coated workpieces, charging with the next workpiece batch and pumping down to a pressure $p_T$ to which the following applies:

$10^{-6}$ mbar$<p_T<5\cdot10^{-2}$ mbar, typically $p_T\sim$(move this symbol over following equal sign—translator)$=10^{-3}$ mbar.

This pressure corresponds to the pressure existing in the installation. The set pressure $p_T$ is generally selected such that, during the transfer, a contamination of the substrates in the additional stations by the newly entering substrates is avoided. This step takes 30 to 60 minutes.

Station 2: Heating by radiant heat for 15 to 30 minutes; then etching in an argon plasma or in a metal ion plasma, during which a workpiece temperature T

150° C.$<$T$<$250° C.

is maintained. The etching rate is 5 to 50 nm per minute, as a function of the bias voltage of the workpieces and the ionic current. The etching step again takes 15 to 30 minutes.

Station 3: Another etching in an argon or metal ion plasma, preferably again by argon ions, for 5 to 10 minutes. Then, sputtering-on of an adhesive chrome layer of a thickness of from 0.1 to 1 $\mu$m by a magnetron source as well as sputtering-on of an intermediate layer of tungsten carbide of a thickness of from 0.1 to 1 $\mu$m by a second magnetron source. Each of the above-mentioned coating steps takes up to 5 to 30 minutes.

Station 4: Depositing of the function layer by the sputtering of tungsten carbide with the simultaneous admission of acetylene. A function layer of a thickness of between 1 and 5 $\mu$m is deposited; acetylene with a flow of 150 sccm to 500 sccm is admitted. This step takes 30 to 100 minutes.

As mentioned above, the individual step durations are preferably coordinated with one another such that the workpiece are processed in each station for essentially the same time duration, thus, for example, for about 50 minutes in each of the four stations.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vacuum coating installation for treating multiple workpieces, comprising a central distribution vacuum station having a workpiece transport arrangement controllably driven in said central distribution station for movement essentially along a plane; at least three further vacuum stations for the workpieces communicating by way of workpiece handling openings with said central distribution station, wherein said workpiece transport arrangement is configured and arranged to handle said multiple workpieces from said central distribution chamber through said workpiece handling openings towards and from respective one of said further vacuum stations; a workpiece carrier for more than one of said workpieces being releasably mounted to said workpiece transport arrangement so as to transport and handle said workpieces arranged on said workpiece carrier; and a drive arrangement having a releasable coupling for said workpiece carrier in at least one of said further vacuum stations.

2. Coating installation according to claim 1, wherein at least one of said stations is a coating station.

3. The installation of claim 2, wherein said coating station comprises at least one source for layer deposition by one of PVD and of PECVD.

4. The installation of claim 3, wherein said coating station has at least one inlet connected with a gas supply device containing a reactive gas.

5. The installation according to claim 1, wherein at least one of said stations comprises at least one of the following sources:
   a thermal vaporizing source,
   a cathodic arc vaporizing source,
   a magnetron sputtering source,
   a plasma source for PECVD.

6. The installation according to claim 1, wherein at least one of said stations is a station for at least one of PVD processing and of PECVD processing.

7. The installation according to claim 1, wherein one of said stations is a heating station.

8. The installation according to claim 1, wherein one of said stations is an etching station.

9. The installation according to claim 1, wherein one of said stations is an etching and heating station and a time control unit is operationally connected therewith to control a heating and an etching operation sequence.

10. The installation according to claim 1, wherein at least one of said stations is provided for different workpiece processing operations, which at least one station is operationally connected with a time control unit to control a time sequence of the different workpiece processing operations thereat.

11. The installation according to claim 1, wherein a time control unit is operatively connected with at least one of a drive for said workpiece transport arrangement in said central distribution station and of a drive for said drive arrangement having a releasable coupling so as to control the timely sequence of transport cycles by said workpiece transport arrangement and of treatment cycles within said at least one of said further vacuum stations.

12. The installation of claim 1, further comprising a time control unit controlling the installation such that the workpieces to be treated stay in said at least three further vacuum stations essentially for an equally long time.

13. The installation according to claim 1, wherein a sealing arrangement is provided at the workpiece transport arrangement which sealing arrangement is operationally connected with the handling openings in a sealing manner and which is optionally controllable independently of a movement of said workpiece transport arrangement.

14. The installation of claim 1, wherein said drive arrangement for said workpiece carrier comprises a driving connection for said workpiece relative to said workpiece carrier.

15. The installation according to claim 14, wherein said driving connection is configured additionally to act upon said workpiece supports movably disposed at said workpiece carrier.

16. The installation according to claim 1, wherein said workpiece transport arrangement for the workpieces is rotatably movable about a central axis in the central distribution vacuum station and has at least one support arrangement for one workpiece carrier respectively, which support arrangement is radially movable with respect to said central axis.

17. The installation of claim 1, further comprising a time control unit operatively connected at least with a drive of said workpiece transport arrangement in said central distribution chamber and with drive of said drive arrangement having said releasable coupling as well as with drives for load lock valves.

18. The installation of claim 17, wherein said time control unit is freely programmable.

19. The installation of claim 1, wherein said drive arrangement having a releasable coupling comprises a station truncated-cone wheel, which truncated-cone wheel projects into said at least one station, said workpiece carrier having a projecting workpiece carrier truncated-cone wheel, respective abutting surfaces of said station truncated-cone wheel and of said workpiece carrier truncated-cone wheel resting on one another with said workpiece carrier being in said station and in a processing position.

20. The installation of claim 19, wherein at least one of said truncated-cone wheels is axially resiliently disposed respectively on said workpiece and at said at least one station.

21. The installation of claim 19, wherein said workpiece carrier truncated-cone wheel is rotatably driveably coupled with workpiece supports on said workpiece carrier and a motor-operated rotary drive is provided on a station-side being coupled with said workpiece carrier truncated-cone wheel as said workpiece carrier is in processing position within said station.

22. The installation of claim 19, wherein a station-side rotary drive for said workpiece carrier truncated-cone wheel is operatively connected with said station truncated-cone wheel or is directly operatively connected to said workpiece carrier truncated-cone wheel.

23. The installation of claim 19, surfaces of both of said truncated-cone wheel being in mutual contact as said workpiece carrier is in processing position within said station are of electrically conductive material, whereby said surface of said workpiece carrier truncated-cone wheel is electrically connected to an electric source.

24. The installation of claim 23, wherein said electric source is adjustable.

25. The installation according to claim 19, wherein at least one of said abutting surfaces being the smaller one of the respective truncated-cone wheel.

26. The installation according to claim 1, wherein at least one of said stations has at least one inlet connected with a gas supply device containing at least one of the following gasses:

nitrogen hydrogen, a carbon-containing gas, a silicon-containing gas.

27. Installation according to claim 1, wherein the workpiece carrier has a sealing plate for the handling openings connecting the stations, which sealing plate is connected with the workpiece carrier to form a unit, and, on at least one of the openings, a tensioning device is provided to be operated independently of the workpiece transport arrangement, which tensioning device affects a sealing plate placed on the handle opening.

28. Installation according to claim 27, wherein the tensioning arrangement comprises a roller arrangement, on a station side or on a sealing plate side, which is displaceable by a motor, and a cam plate, and the roller arrangement is in an operative connection with a curved path of the cam plate for establishing or releasing sealing pressure between the sealing plate and an opening edge.

29. The installation according to claim 1, wherein at least one of said stations is provided with a source, which release at least one of the following materials:

a metal or an alloy including at least one of Ti, W, Al, Cr, Mo;

Si, C; and an oxide, nitride, oxynitride, carbide, oxycarbide, oxycarbonitride, sulfide of one of the above-mentioned metals or alloys.

30. Installation according to claim 1, wherein the workpiece transport arrangement in the central distribution vacuum station, has a shears mechanism respectively for respective individual workpiece carriers, with one pair of lever arrangements which are centrally swivellably disposed relative to one another such that swivel bearing lever arms to respective lever end bearings are of the same length.

31. The installation according to claim 30, wherein at least one end-disposed lever swivel bearing of the shears mechanism is linearly displaceably disposed on a central arrangement of the workpiece transport arrangement, and a drive of the shears mechanism comprises a linear drive for the at least one linearly displaceably disposed end bearing or comprises a swivel drive.

32. The installation of claim 31, wherein said drive of said shears mechanism comprises a swivel drive, said swivel drive comprising a drive which acts by way of a cam disk and a lever upon one of the shears levers.

33. The installation of claim 1, further comprising a sealing arrangement for said handling openings forming with said workpiece carrier a unit respectively.

34. Electric and/or mechanical coupling arrangement between a vacuum treatment station and a workpiece holder with workpieces to be processed in the station, comprising a station-side truncated-cone wheel and a workpiece-holder-side truncated-cone wheel, whose small faces, in a processing position of the workpiece carrier in the station, rest on one another and establish a mechanical driving connection and/or an electric transmission connection from the station to the workpiece carrier.

* * * * *